(12) United States Patent
Boemler

(10) Patent No.: US 7,265,706 B2
(45) Date of Patent: Sep. 4, 2007

(54) MINIMIZED SAR-TYPE COLUMN-WIDE ADC FOR IMAGE SENSORS

(75) Inventor: Christian Boemler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/293,262

(22) Filed: Dec. 5, 2005

(65) Prior Publication Data

US 2006/0145906 A1   Jul. 6, 2006

Related U.S. Application Data

(62) Division of application No. 10/928,316, filed on Aug. 30, 2004, now Pat. No. 7,015,844.

(51) Int. Cl.
*H03M 1/34* (2006.01)
(52) U.S. Cl. .................................. 341/163; 348/248
(58) Field of Classification Search .......... 341/143, 341/144, 155, 163; 348/294, 248
See application file for complete search history.

(56) References Cited

U.S. PATENT DOCUMENTS

| | | | |
|---|---|---|---|
| 6,222,175 B1 * | 4/2001 | Krymski | 250/208.1 |
| 6,344,877 B1 | 2/2002 | Gowda et al. | |
| 6,424,375 B1 | 7/2002 | Fowler | |
| 6,600,471 B2 | 7/2003 | Lee et al. | |
| 6,753,851 B2 | 6/2004 | Choi et al. | |
| 6,780,666 B1 * | 8/2004 | McClure | 438/57 |
| 6,914,627 B1 * | 7/2005 | Dong | 348/248 |
| 7,015,844 B1 * | 3/2006 | Boemler | 341/143 |
| 2004/0032627 A1 | 2/2004 | Tsai | |
| 2004/0251482 A1 * | 12/2004 | Rhodes | 257/292 |

OTHER PUBLICATIONS

Gary L. Baldwin, "All-MOS Charge Redistribution Analog-to-Digital Conversion Techniques—Part 1," IEEE Journal of Solid-State Circuits, vol. SC-10, No. 6, Dec. 1975.
Ricardo E. Suarez, "All-MOS Charge Redistribution Analog-to-Digital Conversion Techniques—Part II," IEEE Journal of Solid-State Circuits, vol. SC-10, No. 6, Dec. 1975.

* cited by examiner

*Primary Examiner*—Rexford Barnie
*Assistant Examiner*—Joseph Lauture
(74) *Attorney, Agent, or Firm*—Dickstein Shapiro LLP

(57) ABSTRACT

An improved analog-to-digital converter wherein a minimal amount of circuitry is provided for conversion of an analog signal to a series of digital bits. A comparator is provided for generating digital values to which the digital bits correspond. A digital-to-analog converter is provided for generating, via successive approximation, a feedback analog signal based on bits previously generated by the comparator. The analog-to-digital converter compares the feedback analog signal to the input analog signal, and based on the comparison generates a digital value that corresponds to a digital bit. In the method of the invention, an analog signal is converted to a digital value using the analog-to-digital converter, and a digital-to-analog converter comprising two capacitors and a reference selector generates, via successive approximation, a feedback analog signal that is applied to a comparator for comparison to the input analog signal being digitized.

5 Claims, 15 Drawing Sheets

Vrst=2V
Vampoff=0.05V
Vsig=1V
VrefL=0.8V
VrefH=2.5V
Vs/h= [(Vrst + Vampoff) - Vsig]=2.05V - 1V = 1.05V
Vin=[Vs/h + VrefL] = 1.05+0.8=1.85V
DACreset=1/2[VrefL+VrefH] = 1/2[0.8V +2.5V] = 1.65V
N=10 (I.E., 10 BITS RANGING FROM $BIT_9$ THROUGH $BIT_0$)
EXAMPLE BIT VALUES FOR $BIT_9$ THROUGH $BIT_7$ OF 10 BIT SERIES Bit Being Generated: MSB $Bit_{N-1}$ (e.g., $Bit_9$)

| C1 (VDACcap1) | C2 (VDACcap2) | x value for SAR | DACtemp out | DACout | Vin | Addr. (bit# addr location) | Mem0 | Mem 1 | Mem 2 | Mem 3 | Mem 4 | Mem 5 | Mem 6 | Mem 7 | Mem 8 | Mem 9 |
|---|---|---|---|---|---|---|---|---|---|---|---|---|---|---|---|---|
| 0.8V | 2.5V | - | - | 1.65V= DACreset | 1.85V | 9 | - | - | - | - | - | - | - | - | - | 1 |

Bit Being Generated: Second Most Significant $Bit_{N-2}$ (e.g., $Bit_8$)

| 2.5V | 1.65V= DACreset | x=i+1=9 | 2.075V | 2.075V | 1.85V | 8 | - | - | - | - | - | - | - | - | 0 | 1 |

Bit Being Generated: Third Most Significant $Bit_{N-8}$ (e.g., $Bit_7$)

| 0.8V | 1.65V= DACreset | x=i+1=8 | 1.225V | - | 1.85V | 7 | - | - | - | - | - | - | - | - | 0 | 1 |
| 2.5V | 1.225V | x=i+2=9 | 1.8625V | 1.8625V | 1.85V | 7 | - | - | - | - | - | - | - | 0 | 0 | 1 |

FIG. 12

MINIMIZED SAR-TYPE COLUMN-WIDE ADC FOR IMAGE SENSORS

CROSS-REFERENCE TO RELATED APPLICATION

This application is a divisional of application Ser. No. 10/928,316 filed Aug. 30, 2004 and now U.S. Pat. No. 7,015,844.

The present invention relates generally to analog-to-digital converters in imager devices and to methods for using the same.

BACKGROUND OF THE INVENTION

Analog-to-digital converters ("ADCs") convert an incoming analog signal to a corresponding series of digital bits. Image sensing devices (i.e., image sensors) generate analog signals that are typically converted by ADCs to digital bit values as part of image processing. Image sensors typically employ light detecting elements (e.g., photosensors) and are used in various applications. Such image sensors may be formed using a variety of fabrication techniques. Currently, two commonly fabricated image sensors are CMOS image sensors and charge coupled device (CCD) image sensors. Each sensor generally includes an array of pixels containing the photosensors. The image sensors typically use photosensors in the form of photogates, phototransistors or photodiodes.

When an image is focused on the image sensor array (also called an "imager array" or "pixel array"), light corresponding to the image is directed to the pixels usually through micro-lenses. Each micro-lens may be used to direct incoming light through a circuitry region of the corresponding pixel to the photosensor region, thereby increasing the amount of light reaching the photosensor. It is known in the art to use circuitry that includes storage regions (for example, floating diffusion regions) that collect pixel charge representing the light reaching the photosensors.

In a CMOS imager, the pixel array discharges this pixel charge as an analog voltage signal that is proportional to the light collected by the photosensor. It is known in the art to use row select transistors to select a particular row in the pixel array and cause the storage element (e.g., a floating diffusion region) for each pixel in the selected row to discharge its voltage for further processing by image sensor circuitry. In this way, the pixel array circuitry discharges the voltage stored in each column of the pixel array one row (i.e., the selected row) at a time. The discharged analog voltage signals may be used to replicate an image represented by the light incident on the photosensors of the array (i.e., the incident light). For example, the discharged analog voltage signals may be used to display a corresponding image on a monitor or to otherwise provide information about the image.

It is known in the art to convert analog voltage signals to digital signals using an ADC that uses a successive approximation ("SAR") method, where digital bit values are successively approximated using the values of previously generated bits. An ADC typically includes: a sample and hold circuit for sampling and holding analog signals; a comparator for comparing an input analog signal to a feedback analog signal and for outputting a corresponding digital value; memory for storing digital bit values; and a feedback loop comprising a digital-to-analog converter ("DAC") for generating the feedback analog signal. In operation, the DAC receives a digital value (e.g., a digital bit previously generated by the ADC) and outputs a corresponding analog signal that is applied to one of the comparator inputs and used to generate the next successive digital bit value of the digital bit series.

Error signals may arise in the analog voltage signal applied to the comparator of an ADC employed in an image sensor. For example, such errors may arise because of floating diffusion reset noise embedded in the incoming analog voltage signal. In image sensors, the floating diffusion region of a pixel acts as a capacitor that stores charge corresponding to the light incident on the pixel photosensors. Each time pixel charge is read out of the floating diffusion region, the floating diffusion region must be set to a reference level (the "floating diffusion reset level") in order to accept the next incoming charge. Thus, when the floating diffusion region of the pixel array discharges, the resulting output (e.g., $V_{sig}$) includes not only the charge representing the incident light, but may also include noise in the floating diffusion reset level. Such noise is undesirable.

For a comparator in the form of an operational amplifier, error signals also may arise due to offset values that are inherent to the operational amplifier and therefore embedded in the operational amplifier output. Such offset values are undesirable.

Successive approximation type ADCs that require one storage capacitor for storing the value of each bit of an N-bit series (i.e., N capacitors) are known in the art. For example, if ten bits are to be converted, the ADC circuitry includes ten capacitors. Such configurations require significant die area to accommodate the numerous circuit elements. Moreover, for high resolution ADCs, the size of the capacitors significantly increases from least significant bit ("LSB") to most significant bit ("MSB") in order to compensate for charge leakage and thermal noise on the MSB capacitor. For example, SARs with charge-sharing DACs are known where each of the N capacitors are sized $2^0, 2^1, 2^2, 2^4 \ldots 2^N$ relative to one another. Such SARs rely on capacitor matching and a large ratio from the largest capacitance to the smallest.

Other DACs having a limited number of capacitors (e.g., two) are known in the art. However, the comparator of these SAR ADCs typically process signals MSB first, LSB last, while serial DACs typically process bits LSB first, MSB last. In order to use such a DAC in an ADC, the comparator of the ADC must completely convert the analog input to digital values before the LSB is generated and DAC processing can begin. This is undesirable.

Furthermore, these known SAR ADCs fail to compensate for offset errors prior to conversion of the pixel cell output (the analog signals) used to generate the digital bits. Therefore these known SAR ADCs fail to adequately account for offset errors from either the comparator or the pixel cells which is undesirable.

DACs that process MSB first, LSB last are also known, but these DACs typically require integrator circuitry prior to transferring the analog output to a comparator. Such integrator circuitry requires additional electronic components (e.g., a separate operational amplifier and a capacitor network and takes up additional die space), and is therefore undesirable.

Other DACs that process MSB first, LSB last are limited to use in monotonic DACs (i.e., the DACs' output either increases (for a digital input of 1) or stays the same (for an input of 0)). Thus, the DAC output is not sufficiently sensitive for high resolution applications such as high speed image sensor applications.

Accordingly, there is a desire and need for an image sensor having a successive approximation type analog-todigital converter comprising circuitry that includes a minimal number of circuit components that take up minimal die area.

There is also a need for an improved method of processing signals through an image sensor using a successive approximation type analog-to-digital conversion method having a serial digital-to-analog converter that is capable of processing bits MSB first, LSB last.

There is further a need for an improved method of correcting for error signals in a successive approximation type analog-to-digital converter.

Further there is a need for an improved method of converting analog signals to digital signals using a successive approximation type analog-to-digital converter comprising a digital to analog conversion method for high resolution applications.

BRIEF SUMMARY OF THE INVENTION

The present invention provides an improved analog-to-digital converter and ADC conversion method for image sensors requiring one amplifier, three capacitors and a buffer per column for converting analog signals by successive approximation. The analog-to-digital converter includes a digital-to-analog converter and digital-to-analog conversion method requiring only previously converted bits of the digital series.

The above and other features and advantages are achieved in various exemplary embodiments of the invention by providing an analog-to-digital converter utilizing a comparator, memory, and a digital-to-analog converter. Successive approximation is used in the present invention to enable the digital-to-analog converter to process signals MSB first, LSB last.

BRIEF DESCRIPTION OF THE DRAWINGS

The foregoing and other advantages and features of the invention will become more apparent from the detailed description of exemplary embodiments provided below with reference to the accompanying drawings in which:

FIG. 12 is a chart of example bit values generated using the exemplary method of FIGS. 6-10.

DETAILED DESCRIPTION OF THE INVENTION

In the following detailed description, reference is made to the accompanying drawings which form a part hereof, and which illustrate specific embodiments of the present invention. These embodiments are described in sufficient detail to enable those of ordinary skill in the art to make and use the invention. It is also understood that structural, logical, or procedural changes may be made to the specific embodiments disclosed without departing from the spirit and scope of the present invention. The following detailed description is not to be taken in a limiting sense, and the scope of the present invention is defined only by the appended claims.

Figure 1A:
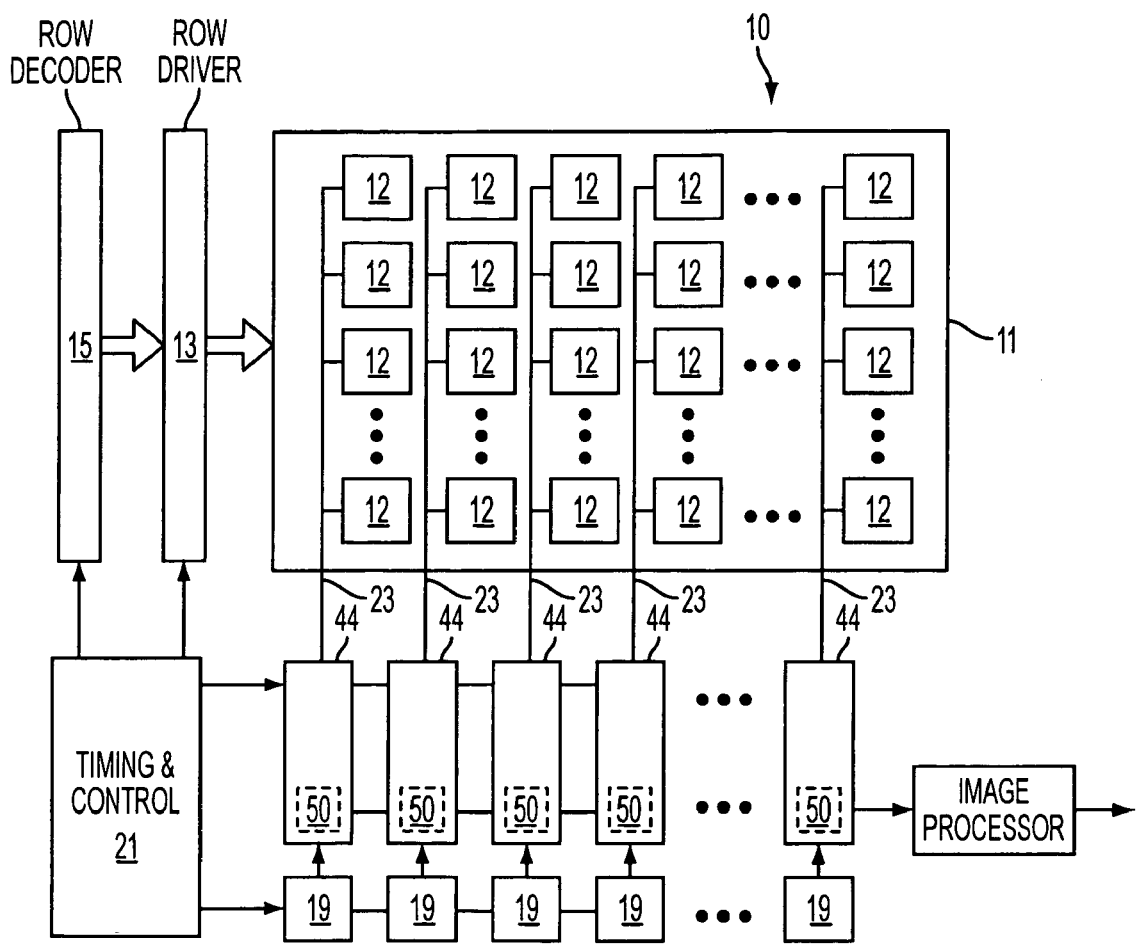
FIG. 1A is a block diagram of a conventional image sensor.

FIG. 1A illustrates a block diagram for a CMOS imager 10. The imager 10 includes a pixel array 11. The pixel array 11 comprises a plurality of pixels arranged in a predetermined number of columns and rows. The pixels of each row in array 11 are all turned on at the same time by a row select line and the pixels of each column are selectively output by a column select line. A plurality of row lines (not shown) and column lines are provided for the entire array 11.

The row lines are selectively activated by the row driver 13 in response to row address decoder 15 and the column select lines are selectively activated in response to column address decoder 19. Through the use of address decoders 15 and 19, a row and column address is provided for each pixel. The CMOS imager 10 is operated by the control circuit 21, which controls address decoders 15, 19 for selecting the appropriate row and column lines for pixel readout, and row driver circuitry 13 which apply driving voltage to the drive transistors of the selected row lines. Although a column driver may be used, it is not required for a column parallel architecture because the column decoder 19 may be used to drive the selected column as illustrated in FIG. 1. A column parallel analog-to-digital converter ("ADC") 44 is used to convert analog signals received from a given pixel in a corresponding column to a digital value which may be stored in memory 50. For a given imager with Y rows and X columns of pixels, there will be X ADC's 44 or a ratio thereof. As one row of pixels is selected, the X ADC's 44 convert the pixels signals from that row simultaneously to digital codes that are stored in one N-bit memory array per column 50.

The pixel signal, $V_{sig}$, output from the pixel array is an analog voltage. Pixels also generate a floating diffusion reset signal, $V_{rst}$, that is used to adjust the pixel signal $V_{sig}$ by subtracting $V_{sig}$ from $V_{rst}$ (i.e., $V_{rst}-V_{sig}$). This adjusted pixel signal, $V_{rst}-V_{sig}$, is the signal that is digitized by an analog-to-digital converter (ADC) in the column parallel array of ADC's with one ADC 44 per column.

Figure 1B:
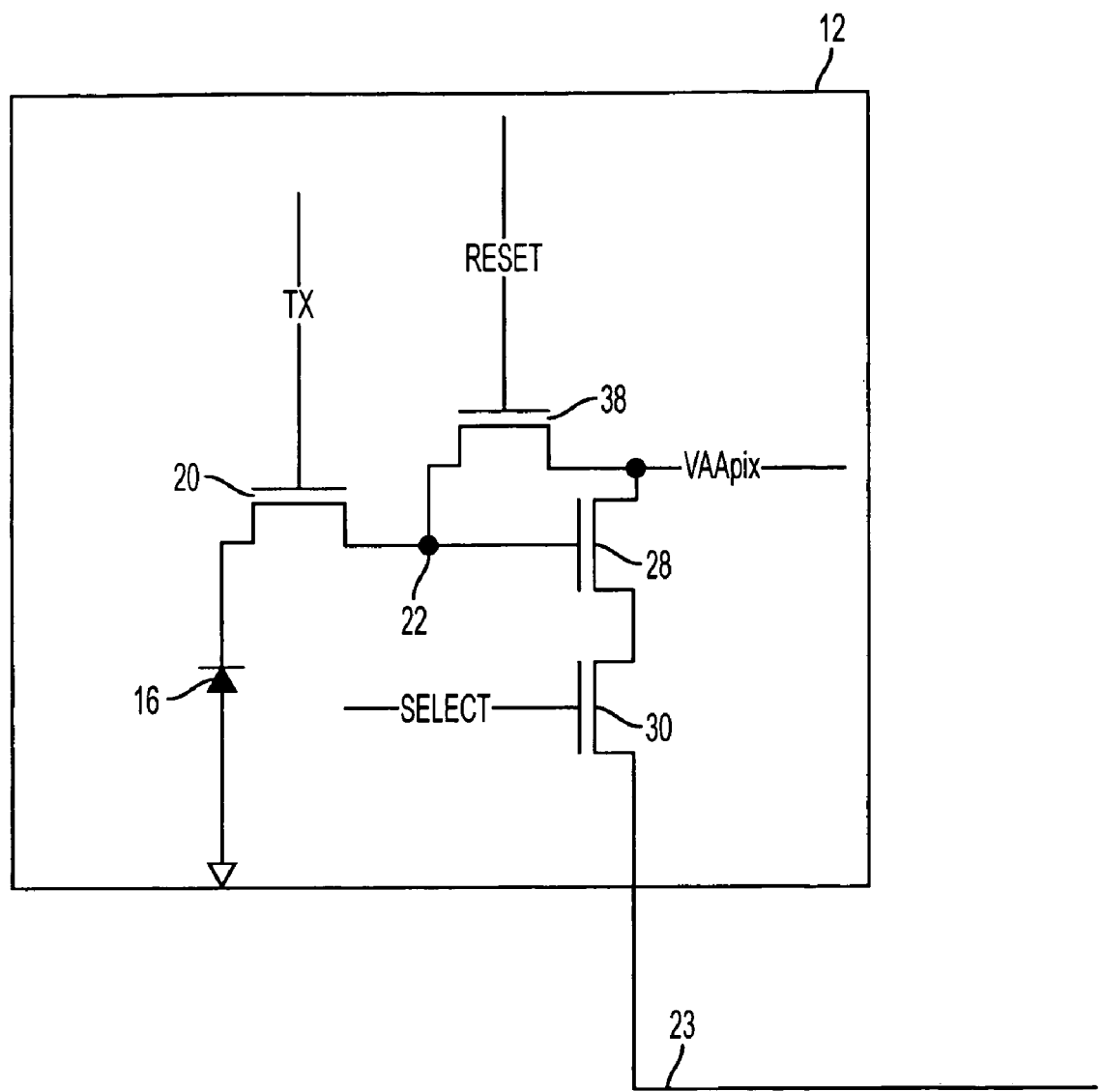
FIG. 1B is a schematic of a pixel cell in an image sensor that generates analog signals.

FIG. 1B shows a pixel cell 12 used in a CMOS imager such as the imager 10 illustrated in FIG. 1A. The pixel cell 12 includes a photosensor 16, floating diffusion node 22, transfer transistor 20, reset transistor 38, source follower transistor 28 and row select transistor 30. The photosensor 16 is shown as a photodiode, but other forms of photosensors may be used (for example a photogate, etc.). The photosensor 16 is connected to the floating diffusion node 22 by the transfer transistor 20 when the transfer transistor 20 is activated by a control signal TX. The reset transistor 38 is connected between the floating diffusion node 22 and an array pixel supply voltage $V_{aa-Pix}$. A reset control signal RESET is used to activate the reset transistor 38, which resets the floating diffusion node 22 to set it to $V_{rst}$ as is known in the art.

The source follower transistor 28 has its gate connected to the floating diffusion node 22 and is connected between pixel supply voltage $V_{aa-Pix}$ and the row select transistor 30. The source follower transistor 28 converts the stored charge at the floating diffusion node 22 into an electrical output voltage signal. The row select transistor 30 is controllable by a row select signal SELECT for selectively connecting the source follower transistor 28 and its output voltage signal to a column line 23 of a pixel array. It should be appreciated that the illustrated pixel 12 is an example of the type of pixel that may be used with the invention and that the invention is not limited to the type or configuration of the pixel 12.

In operation, the column voltages $V_{rst}$ and $V_{sig}$ for the pixel 12 are each respectively discharged to an analog-to-digital converter which generates the adjusted pixel voltage signal ($V_{rst}-V_{sig}$) and digitizes these voltages.

Figure 2:
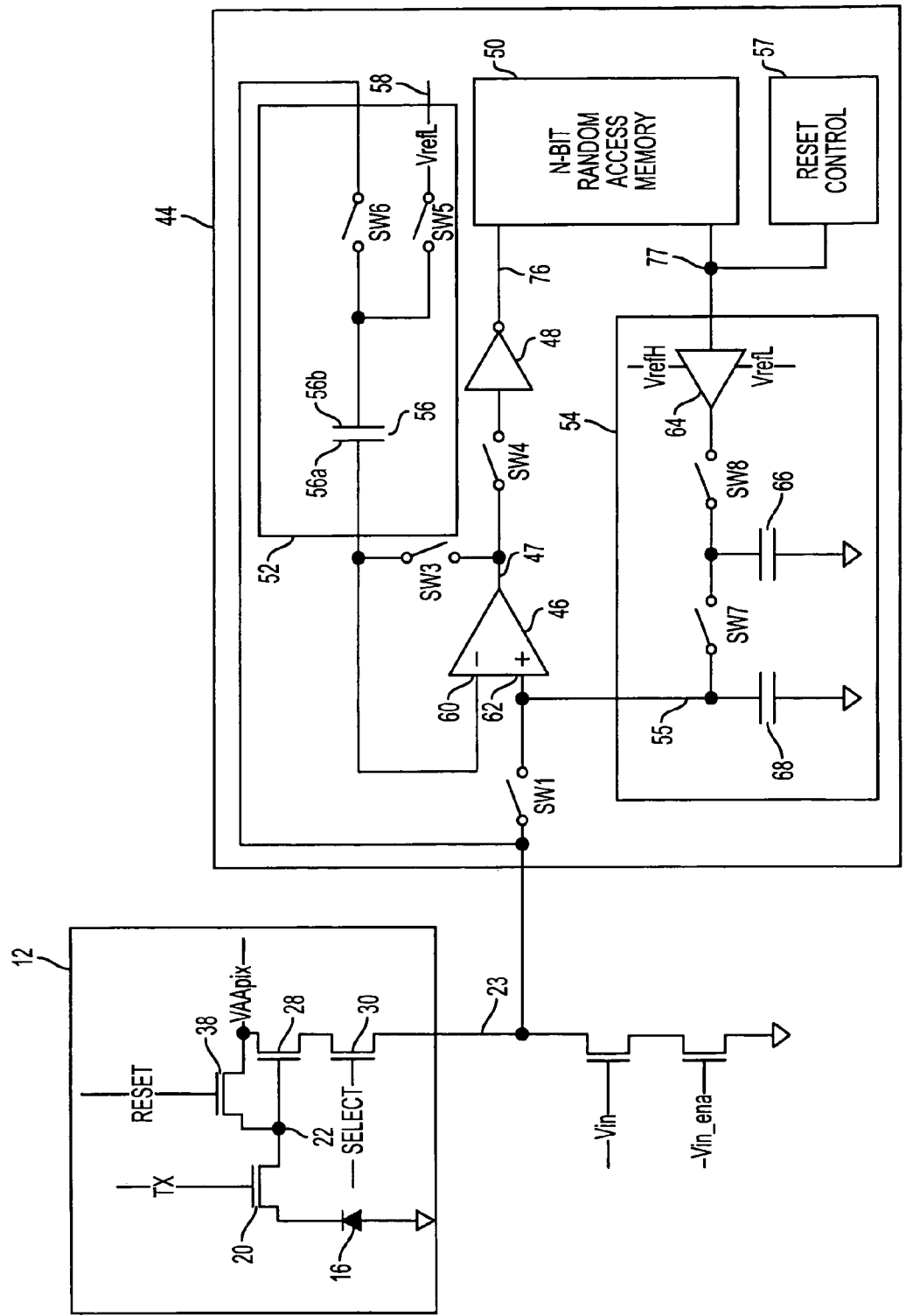
FIG. 2 is a schematic of an exemplary embodiment of an image sensor having an analog-to-digital converter.

An exemplary embodiment of one ADC 44 in the array of ADC's is shown in FIG. 2. ADC 44 may be used to convert the analog signals, received from pixel cells 12, to digital signals. As shown in FIG. 2, the ADC 44 includes an operational amplifier 46, output buffer 48, memory 50, sample and hold circuit 52, and DAC 54. As shown in FIG. 2, ADC 44 is coupled to an array of pixel cells 12 (for clarity purposes, only one cell 12 having a photosensor 16, transfer gate 20, reset gate 38, row select transistor 30 and source follower transistor 28 is shown).

As further shown in FIG. 2, sample and hold circuit 52 may comprise a sample and hold capacitor 56 coupled at one plate 56b via switch SW6 to pixel cell 12, and via switch SW5 to a voltage source 58 that generates a low reference voltage $V_{refL}$. Sample and hold capacitor 56 is coupled at its other plate 56a to a first input line 60 of operational amplifier 46, and (via switch SW3) to an amplifier output line 47. Sample and hold capacitor 56 may be used to apply an analog voltage signal, $V_{in}$, to the first input line 60 for conversion to digital bits.

A second input line 62 of operational amplifier 46 is coupled via switch SW1 to pixel cell 12. Second input line 62 is also coupled to the feedback output line 55 of the DAC 54, such that the DAC output value may be applied as an input to operational amplifier 46.

Preferably, a switch SW4 couples amplifier output line 47 to the output buffer 48 (preferably an inverter). As further shown in FIG. 2, an output line 75 couples operational amplifier 46 (and preferably output buffer 48) to the memory 50. When SW4 is in the open position, it decouples the operational amplifier 46 output from output buffer 48 (as well as from memory 50) and, when operational amplifier 46 is in analog mode, this open SW4 configuration prevents high operating current in inverter 48.

According to the exemplary embodiment of FIG. 2, memory 50 is also coupled to DAC 54. DAC 54 comprises a reference selector 64, a first capacitor 66 and a second capacitor 68. Preferably capacitors 66, 68 are matched capacitors. Switch SW8 couples DAC reference selector 64 to first capacitor 66. Preferably, an input of reference selector 64 is coupled to a node 77 for receiving command signals from a reset control block 57. Switches SW8 and SW7 couple DAC reference selector 64 and first capacitor 66 to second capacitor 68 and feedback output line 55.

DAC 54 of the exemplary embodiment outputs an analog voltage on line 55 that is determined by the value of the digital bit value that is input to the DAC reference selector 64. The DAC 54 output voltage is applied via feedback output line 55 to second input line 62 of operational amplifier 46. During a compare mode of operational amplifier 46, the DAC output voltage is compared to the analog voltage, $V_{in}$, that is applied at first input line 60. $V_{in}$ corresponds to the analog voltage from pixel cells 12. As a result of comparing the voltages at its first input line 60 and second input line 62, operational amplifier 46 generates a digital value, and a corresponding value is stored in memory 50 as $bit_i$ of an N-bit digital series.

The ADC 44 of FIG. 2 may be fabricated according to conventional semiconductor fabrication processes (e.g., mask-based/lithography or other fabrication processes known in the art). The ADC 44 may be fabricated on a chip comprising the circuitry for generating the analog voltages that are supplied to ADC 44, such as for example on an imager chip.

Figure 3A:
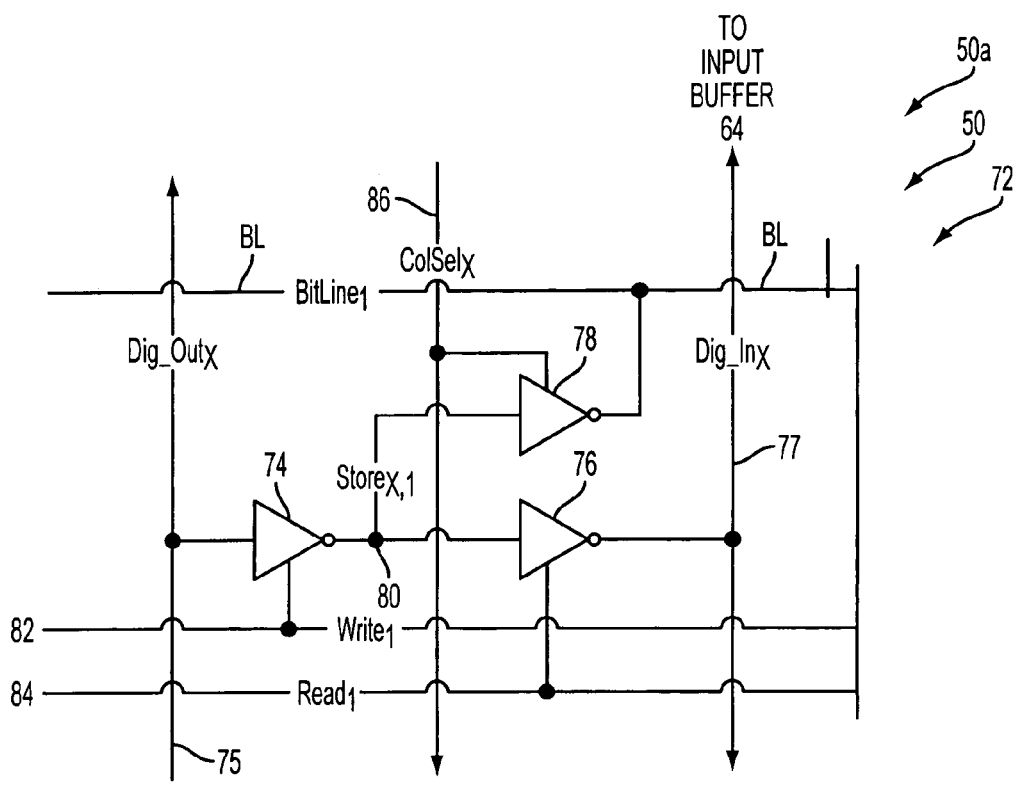
FIG. 3A is a schematic of an exemplary embodiment of the memory of the image sensor of FIG. 2.

FIG. 3a illustrates an exemplary embodiment of a memory 50a that can be used as memory 50 (FIG. 2) for storing digital bit values generated by the ADC 44 of FIG. 2. Memory 50a comprises a RAM cell 72 including three tri-state inverters, 74, 76, 78. First tri-state inverter 74 receives a digital bit value from ADC 44 via amplifier output line 75. First tri-state inverter 74 is also coupled to a write command signal line 82. Upon receiving a write command via write command signal line 82, first tri-state inverter 74 inverts the digital bit value received from ADC 44 and outputs it to store node 80. Store node 80 is coupled to the inputs of the second tri-state inverter 76 and the third tri-state inverter 78.

Second tri-state inverter 76 is also coupled to a read command signal line 84. Upon receiving a read command on line 84, second tri-state inverter 76 inverts the digital bit value stored at store node 80, and outputs the inverted value to digital input line 77, which is the input line of DAC reference selector 64 (FIG. 2). In this way, the digital bit value received from ADC 44 by first tri-state inverter 74 is input to DAC 54.

Third tri-state inverter 78 is coupled to a column select command line 86. Upon receiving a column select signal on line 86, third tri-state inverter 78 inverts the digital bit value stored at store node 80 and drives this inverted value onto the bit line bus BL. In this way, a series of bit values may be read out of column memory 50 (shown in FIG. 1A) successively during line readout.

Figure 3B:
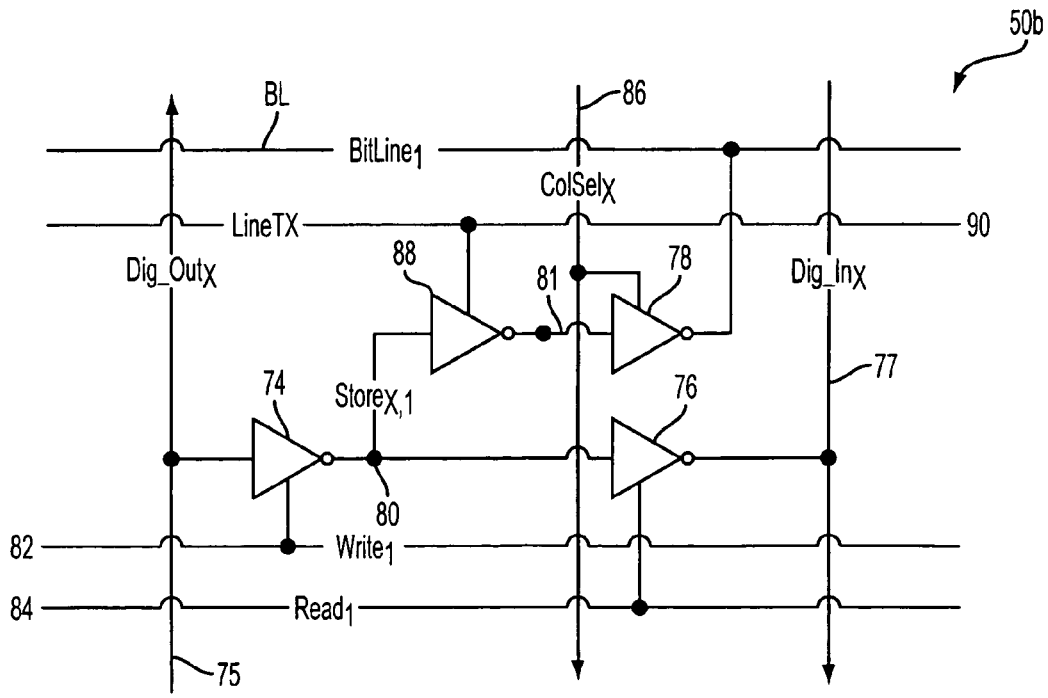
FIG. 3B is a schematic of an alternative exemplary embodiment of the memory of the image sensor of FIG. 2.

FIG. 3b illustrates a memory 50b that can be used as memory 50 (FIG. 2). As shown in FIG. 3b, a fourth tri-state inverter 88 is coupled between store node 80 and third tri-state inverter 78. Fourth tri-state inverter 88 is also coupled to a transfer control line 90. Between bit line readout operations (e.g., between column select commands), a line transfer control signal may be used to cause fourth tri-state inverter 88 to invert the digital bit value stored at store node 80 and transfer the value to a second store node 81 in response to a signal from transfer control line 90. In this way, a value used in the current ADC conversion for a given pixel row can be stored at store node 80, while a value corresponding to the ADC conversion of the preceding pixel row can be simultaneously stored at second store node 81 for readout on bit line bus BL. Because memory 50b uses three tri-state inverters (i.e., tri-state inverters 74, 88, and 78) to buffer a bit value received on line 75, the bit values readout to bit bus line BL are inverted from those received via line 75.

Figure 10:
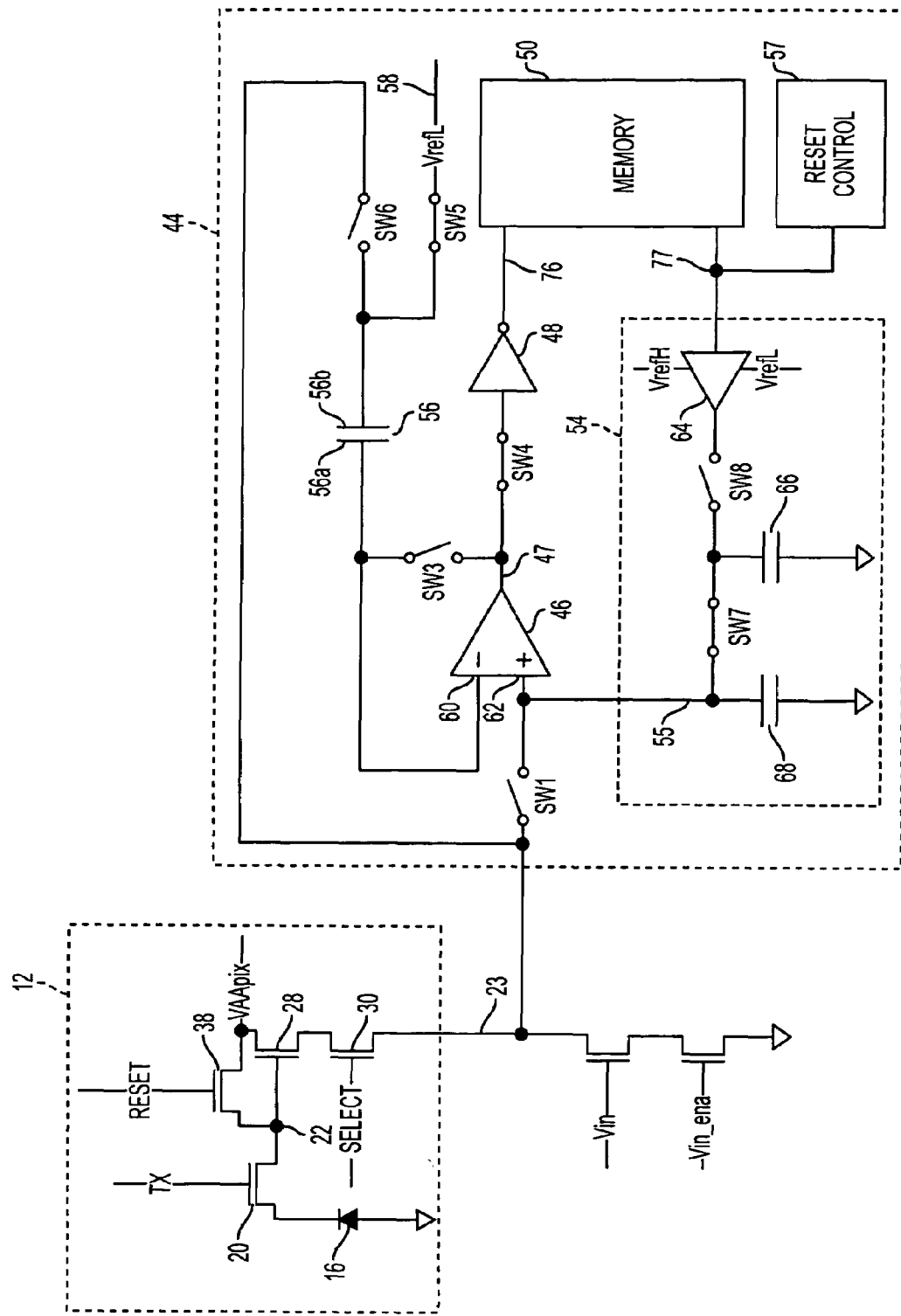
FIG. 10 is a schematic of an exemplary embodiment of the image sensor of FIG. 2 during an exemplary method of generating a bit in an N-bit series having a digital-to-analog converter output voltage generated.
Figure 11A:
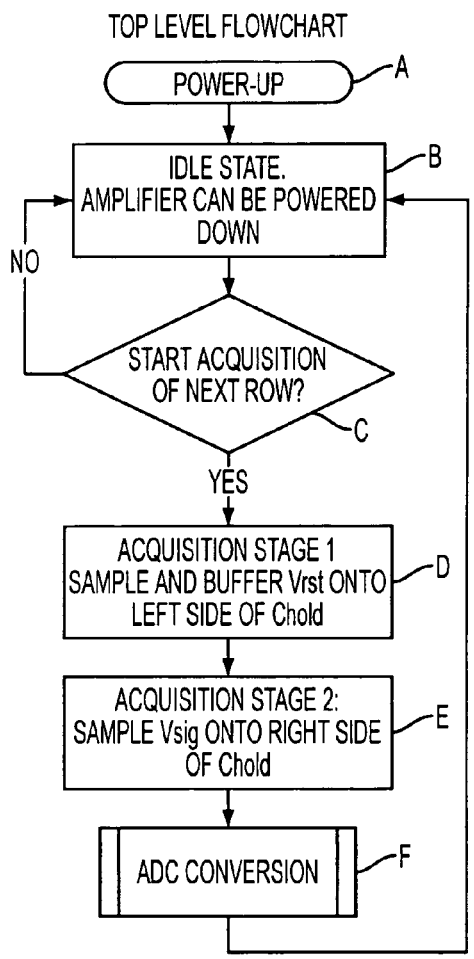
FIG. 11A is a flowchart of top level states of an exemplary embodiment of correlated double sampling and successive approximation during the exemplary method of FIGS. 4-10.

FIG. 11A illustrates top-level states of an exemplary method of Correlated Double Sampling and successive approximation performed using an exemplary image sensor having one ADC 44 of FIG. 2 per column. As shown in FIG. 11A (at steps A-C), upon power up of the system (e.g., the image sensor), an ADC for successive approximation may remain in the idle state with operational amplifier 46 powered down until beginning acquisition of analog signals from a row of pixel cells 12. As shown in FIG. 11A at step D (and further described below with reference to FIG. 4), when beginning the acquisition of analog signals, $V_{rst}$ is sampled and buffered on to the left side of sample and hold capacitor 56. Next, as shown in FIG. 11A at step E (and further described below with reference to FIG. 5), $V_{sig}$ is sampled onto the right side of sample and hold capacitor 56. Next, as further shown in FIG. 11A at step F (and further described below with reference to FIGS. 6-10), the ADC conversion to digital values occurs.

Figure 4:
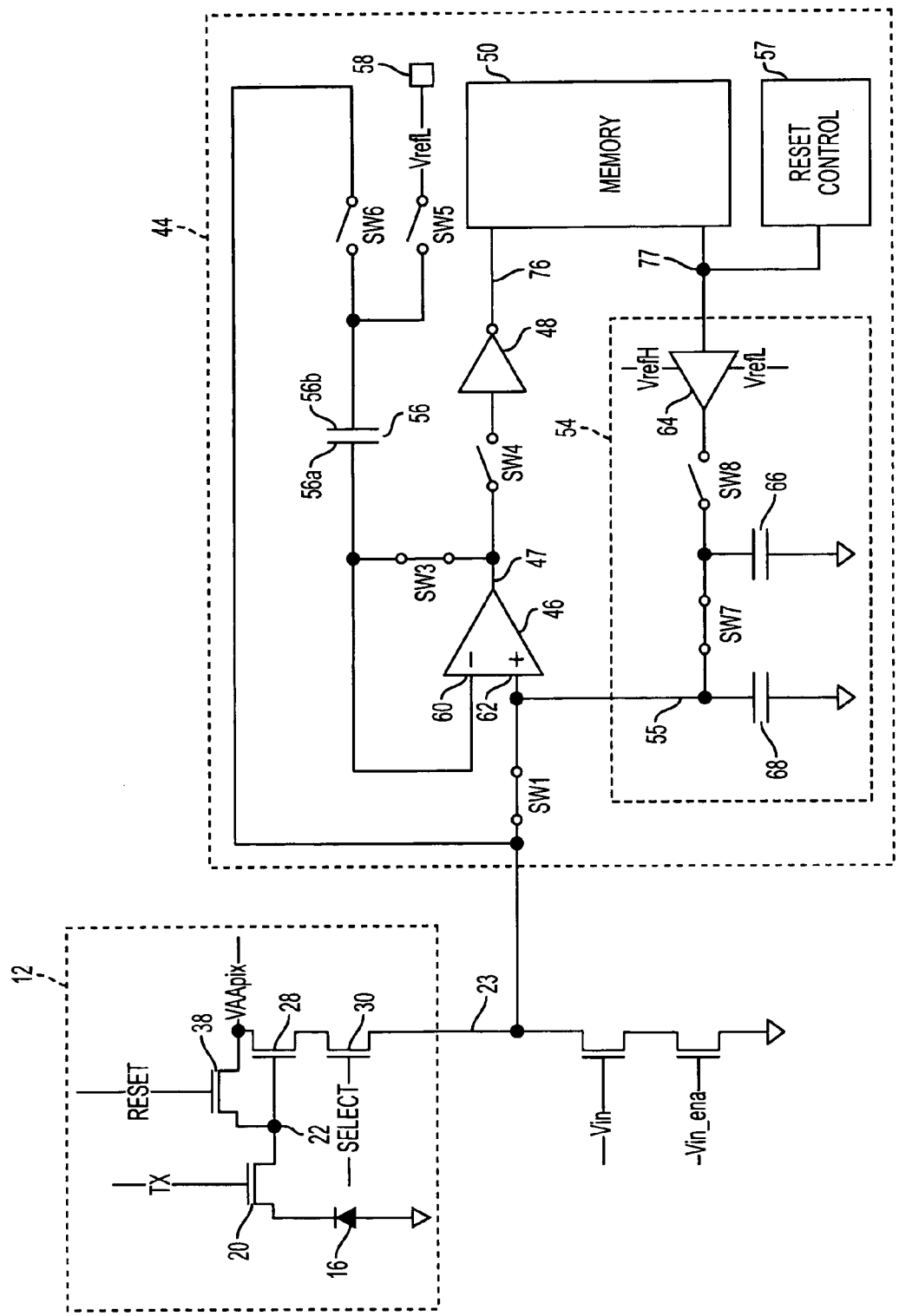
FIG. 4 is a schematic of an exemplary embodiment of the image sensor of FIG. 2 during an exemplary correlated double sampling method having a pixel array output signal with floating diffusion reset voltage applied to a digital-to-analog converter.

An exemplary Correlated Double Sampling ("CDS") method using the ADC 44 of FIG. 2, is now described with reference to FIGS. 4-6 and 11A. A Correlated Double Sampling ("CDS") method may be used to reduce the effect of noise in the analog voltage signal representing the light incident on the pixel cell caused by the floating diffusion region. CDS determines an adjusted pixel voltage signal which is the difference between a floating diffusion reset level ($V_{rst}$) and the analog voltage signal ($V_{sig}$) from the pixel cell. FIG. 4 illustrates a Floating Diffusion Sampling ("FDS") state of the exemplary CDS method. During the FDS state, reset gate 38 drives the floating diffusion reset voltage, $V_{rst}$, on to the floating diffusion region 22, which is output through source follower transistor 28 through switch SW1 to DAC 54. Switch SW7 of DAC 54 is in the closed position while switch SW8 is in the open position. This switch configuration enables first capacitor 66 and second capacitor 68 to sample and hold $V_{rst}$ such that the output of DAC 54 is equal to $V_{rst}$, (i.e., $\frac{1}{2}[V_{rst}+V_{rst}]$). $V_{rst}$ is applied as the DAC output value to second input line 62 of operational amplifier 46. Switch SW6, which couples the output of pixel cell 12 to operational amplifier 46 (through sample and hold capacitor 56) is in the open position, thereby preventing the pixel cell output voltage (e.g., $V_{sig}$) from being coupled through sample and hold capacitor 56 to the first input line 60 of operational amplifier 46. Switch SW5 is also in the open position, preventing the low reference voltage value $V_{refL}$ from being applied to sample and hold capacitor 56. Operational amplifier 46 therefore outputs a signal equal to the DAC output value (i.e., equal to the floating diffusion reset value, $V_{rst}$) plus an inherent operational amplifier offset value, $V_{ampoff}$. For example, using the example voltage values shown in FIG. 12 where $V_{rst}$=2V, and $V_{ampoff}$=0.05V, then operational amplifier 46 outputs a voltage of 2.05V.

During the FDS state, switch SW3 is in the closed position and the operational amplifier 46 output signal ($V_{rst}+V_{ampoff}$) is driven through switch SW3 onto plate 56a of sample and hold capacitor 56. When SW3 is closed, operational amplifier 46 is in unity gain configuration. In this way, $V_{rst}$ is sampled and buffered onto sample and hold capacitor 56 as illustrated in FIG. 11A at step D.

Figure 5:
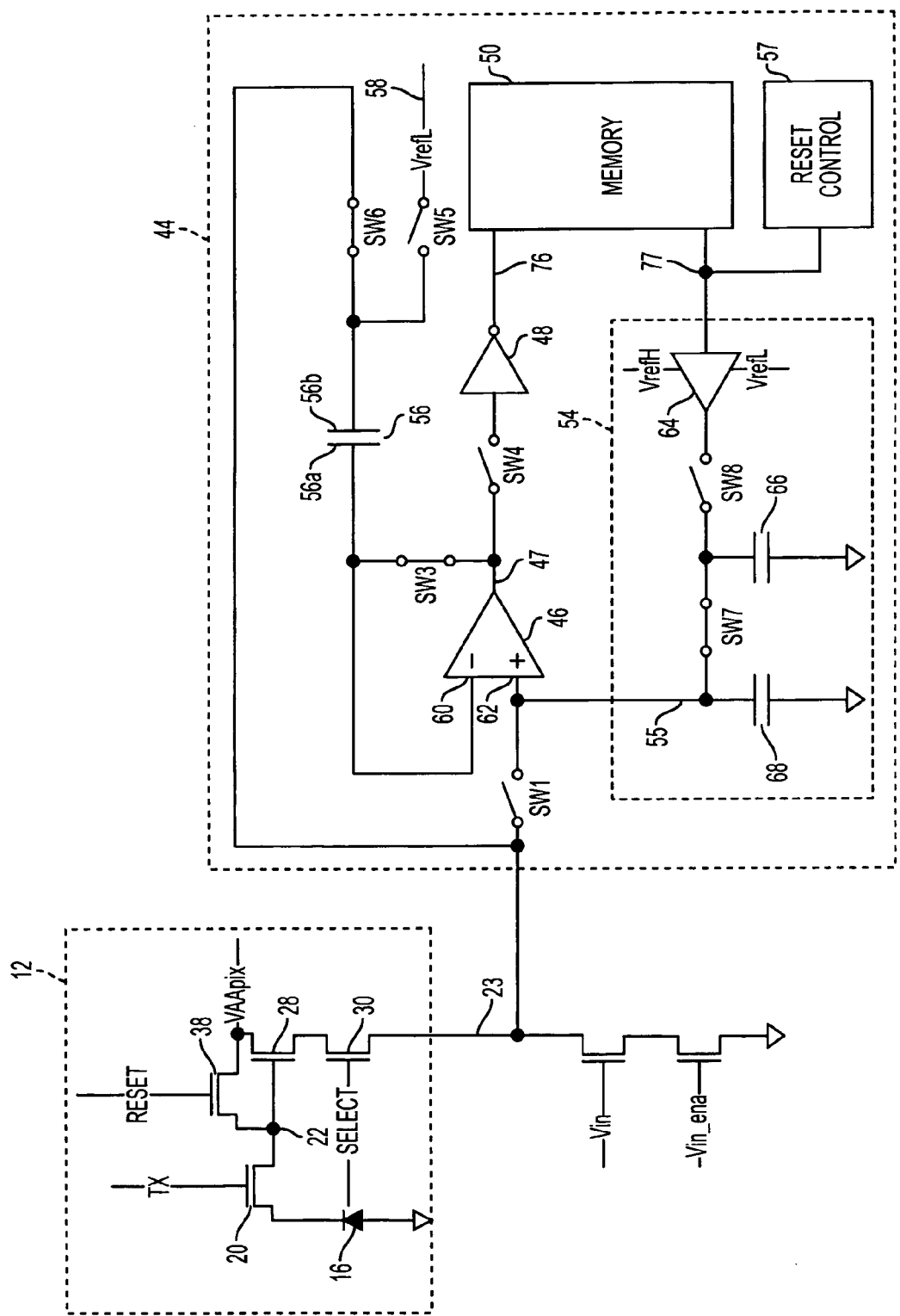
FIG. 5 is a schematic of an exemplary embodiment of the image sensor of FIG. 2 during an exemplary correlated double sampling method having a pixel array output signal and an operational amplifier output signal each sampled and held on an sample and hold capacitor.

A "Signal Sampling" state of the exemplary CDS method is illustrated in FIG. 5. During the Signal Sampling state, switch SW1 is opened, thereby preventing pixel cell 12 from driving an analog voltage value onto either DAC 54 or second input line 62. Pixel cell 12 discharges the analog signal value, $V_{sig}$. Switch SW6 is closed and couples the output line 23 to plate 56b of the sample and hold capacitor 56, thereby applying $V_{sig}$ to plate 56b. For example purposes, as shown in FIG. 12, $V_{sig}$=1V. $V_{sig}$ is applied to plate 56b of sample and hold capacitor 56 (as also illustrated in FIG. 11A at step E). Further, using the example voltages described with reference to the Floating Diffusion Sampling (FDS) state, plate 56a holds $V_{rst}+V_{ampoff}$=2.05V. The voltage across sample and hold capacitor 56 is therefore:

$$V_{s/h}=[(V_{rst}+V_{ampoff})-V_{sig}]= \quad (1)$$

$$2.05V-1V=1.05V \quad (2)$$

Figure 6:
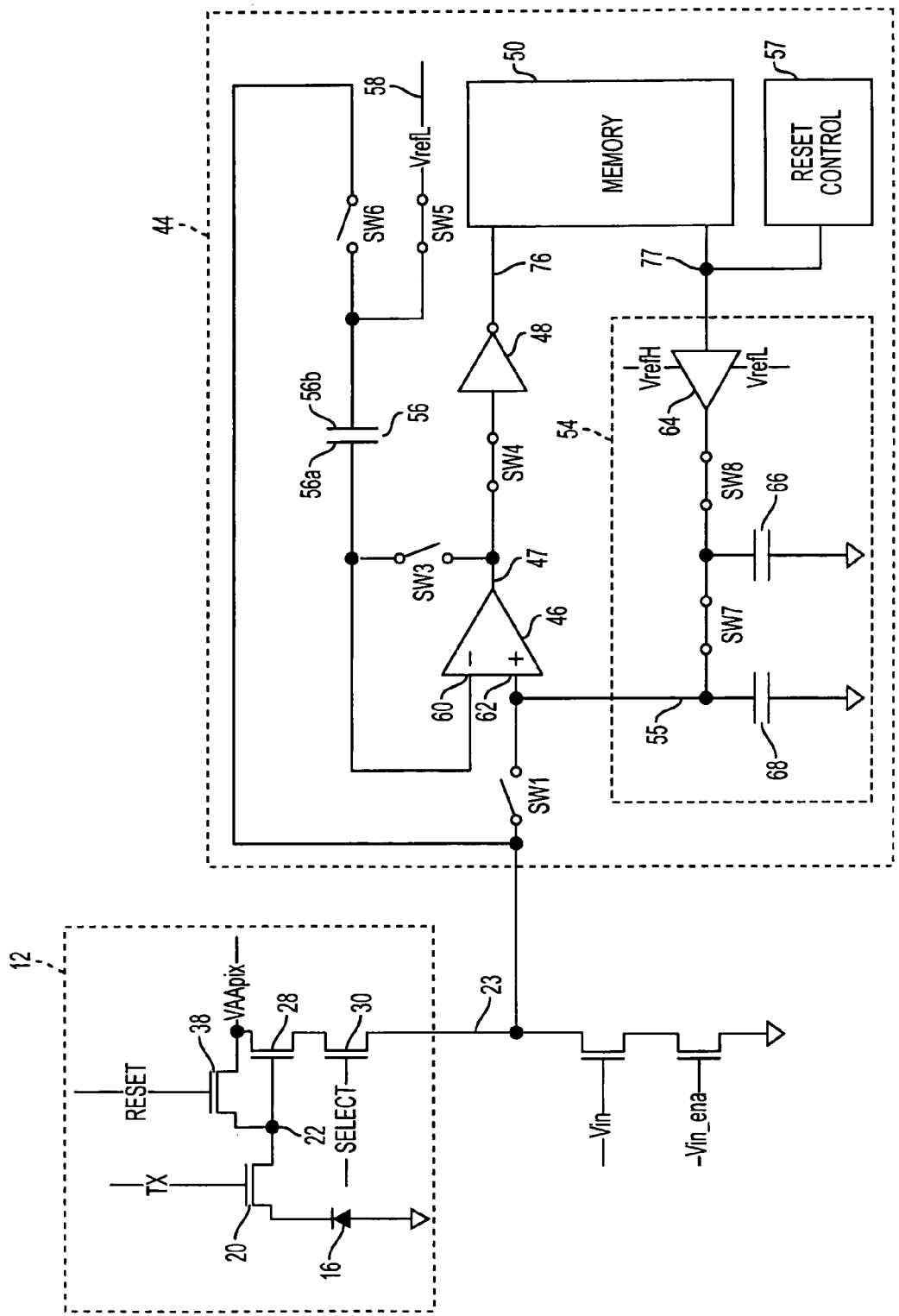
FIG. 6 is a schematic of an exemplary embodiment of the image sensor of FIG. 2 during an exemplary method of generating a bit in an N-bit series having a first reference voltage applied to a digital-to-analog converter.

A "Voltage Adjustment" state of the method is illustrated in FIG. 6. During the Voltage Adjustment state, switch SW5 is in the closed position, thereby coupling plate 56b of sample and hold capacitor 56 to $V_{refL}$. $V_{refL}$ is then strapped to the voltage across sample and hold capacitor 56 (i.e., $V_{s/h}$), causing both voltages to be driven on to first input line 60 of operational amplifier 46. Strapping $V_{refL}$ to $V_{s/h}$ ensures that the voltage signal being digitized is greater than $V_{refL}$ and that the digital output generated by operational amplifier 54 will be near zero at black (i.e., for $V_{rst}=V_{sig}$). The voltage input, $V_{in}$, at input line 60 is:

$$V_{in}=[V_{s/h}+V_{refL}]. \quad (3)$$

For example purposes, as shown at FIG. 12, $V_{s/h}$=1.05V and $V_{refL}$=0.8V. Thus, the voltage at operational amplifier input line 60 becomes $V_{in}=[V_{s/h}+V_{refL}]$=1.05+0.8=1.85V. An ideal comparison voltage is $V_{rst}-V_{sig}+V_{refL}$=1.8V, but the actual compare voltage has an additional voltage equal to the amplifier offset error $V_{ampoff}$ (e.g., 0.05 V). This makes it possible to remove amplifier offset errors from operational amplifier 46 which would otherwise create fixed pattern column noise in the imager.

Figure 11B:
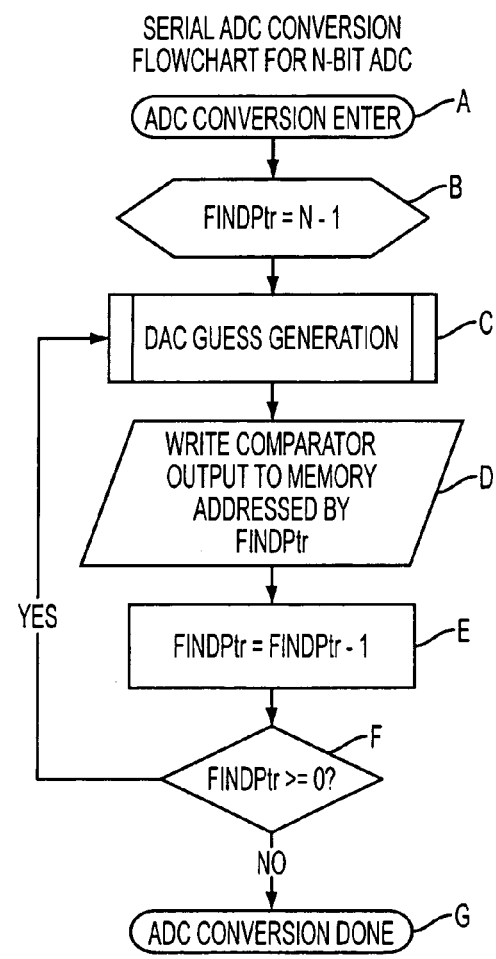
FIG. 11B is a flowchart of top level states of an exemplary embodiment of successive approximation during the exemplary method of FIGS. 6-10.

An exemplary top level flow for ADC conversion is shown in FIG. 11B for converting an analog signal to N bits ranging from N−1 (the MSB) to 0 (the LSB). After entering the ADC conversion process (step A in FIG. 11B), a pointer (i.e., FindPtr) may be used to designate the bit to be determined by the ADC. As shown at step B, the process begins with the pointer set to N−1 (i.e., the most significant bit). Next, as shown at step C, a DAC guess generation is performed for generating an analog value that is compared to $V_{in}$ for generation of the bit that is designated by the pointer (e.g., $bit_{N-1}$ for FindPtr=N−1). The DAC guess generation is described in more detail below with reference to FIGS. 6-10, 11C and 12. Next, as shown in step D, the bit value resulting from the DAC guess generation is written to a memory location having an address corresponding to the pointer (i.e., corresponding to FindPtr). Next, the pointer value is decremented (as shown in step E), and if the decremented pointer value is at or above a minimum value (i.e., if FindPtr>=0) as shown in step F, then steps C-E are repeated. Thus, for example, after decrementing FindPtr from N-1 to N-2, the DAC guess generation process is performed to generate an analog value that is compared to $V_{in}$. Based on this comparison, a bit value is generated (step C) and written to memory 50 (step D) as the second most significant bit (i.e., $bit_{N-2}$) of the N-bit series. FindPtr is decremented from N-2 to N-3 (step E), which is greater than the minimum value of 0 (for FindPtr corresponding to N-1 through 0 (step F)), and steps C-E are repeated to determine $bit_{N-3}$. When the pointer value is not at or above the minimum value, this indicates that all N-bits have been generated (e.g., bit values corresponding to FindPtr=N-1 through 0 have been generated), then as shown in steps F and G, the ADC conversion process is complete.

Figure 7:
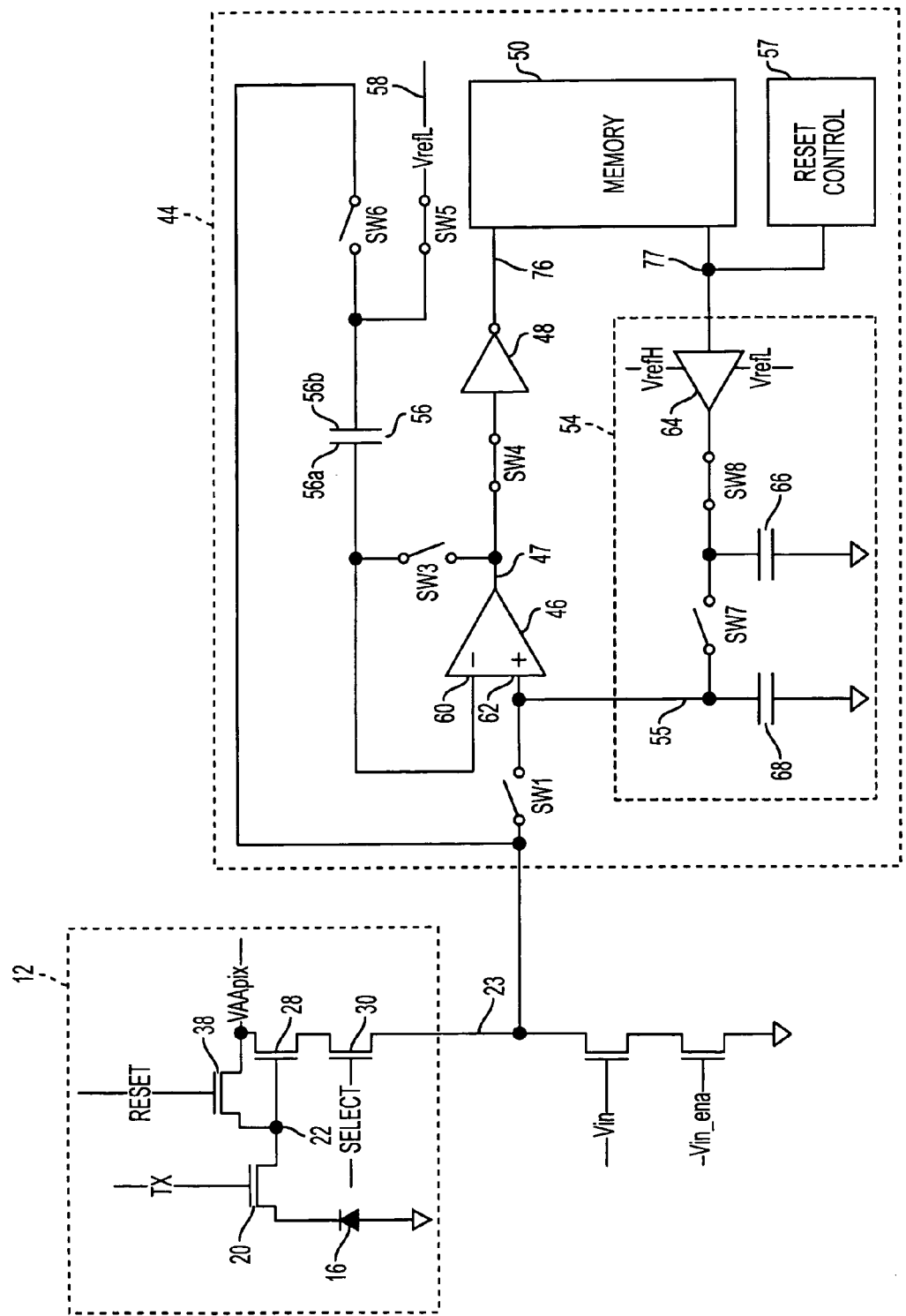
FIG. 7 is a schematic of an exemplary embodiment of the image sensor of FIG. 2 during an exemplary method of generating a bit in an N-bit series having a second reference voltage applied to a digital-to-analog converter.

An exemplary embodiment of a method of using ADC 44 of FIG. 2 to reset DAC 54 and to generate the MSB of an N-bit digital series corresponding to the voltage applied at the first input line 60, $V_{in}$, is now described with reference to FIGS. 6-8.

In addition to the Voltage Adjustment state, a First Capacitor Reset state is illustrated in FIG. 6. During the First Capacitor Reset state, switch SW4 is in the open position, and DAC 54 goes through reset mode as follows. A control signal is applied to reference selector 64. In response to the control signal, reference selector 64 outputs a reference voltage. For example, reference selector 64 may be configured to output $V_{refH}$ in response to a first control signal, and output $V_{refL}$ in response to a second control signal. For example, as shown in FIG. 6, a reset control block 57 may be used to force control signals in the form of logic low and high control values onto node 77 thereby causing reference selector 64 to select $V_{refH}$ in response to logic high or $V_{refL}$ in response to logic low. (Alternatively, $V_{refH}$ could be selected in response to logic low and $V_{refL}$ in response to logic high). Using the example voltages in FIG. 12, $V_{refH}$=2.5V or $V_{refL}$=0.8V. Depending on the control signal, reference selector 64 outputs either a high reference voltage $V_{refH}$ or $V_{refL}$. For example purposes, reference selector 64 outputs $V_{refH}$=0.8V during the First Capacitor Reset state. During this state, as shown in FIG. 6, both switch SW7 and switch SW8 of DAC 54 are in the closed position, thereby coupling reference selector 64 to both first and second capacitors 66, 68. Thus, during the First Capacitor Reset state, the output of reference selector 64 is driven on to first capacitor 66 and second capacitor 68.

During a "Second Capacitor Reset" state (shown in FIG. 7), reference selector 64 outputs a second reference voltage value. If, for example, reference selector 64 outputs $V_{refH}$ in response to a first control signal (e.g., a logic high at node 77), then reference selector 64 will output $V_{refL}$ in response to a second control signal (e.g., a logic low at node 77) during the Second Capacitor Reset state. As shown FIG. 7, during the Second Capacitor Reset state, switch SW7 is in the open position, while switch SW8 remains closed. Thus, the output of reference selector 64 is applied to only first capacitor 66.

Figure 8:
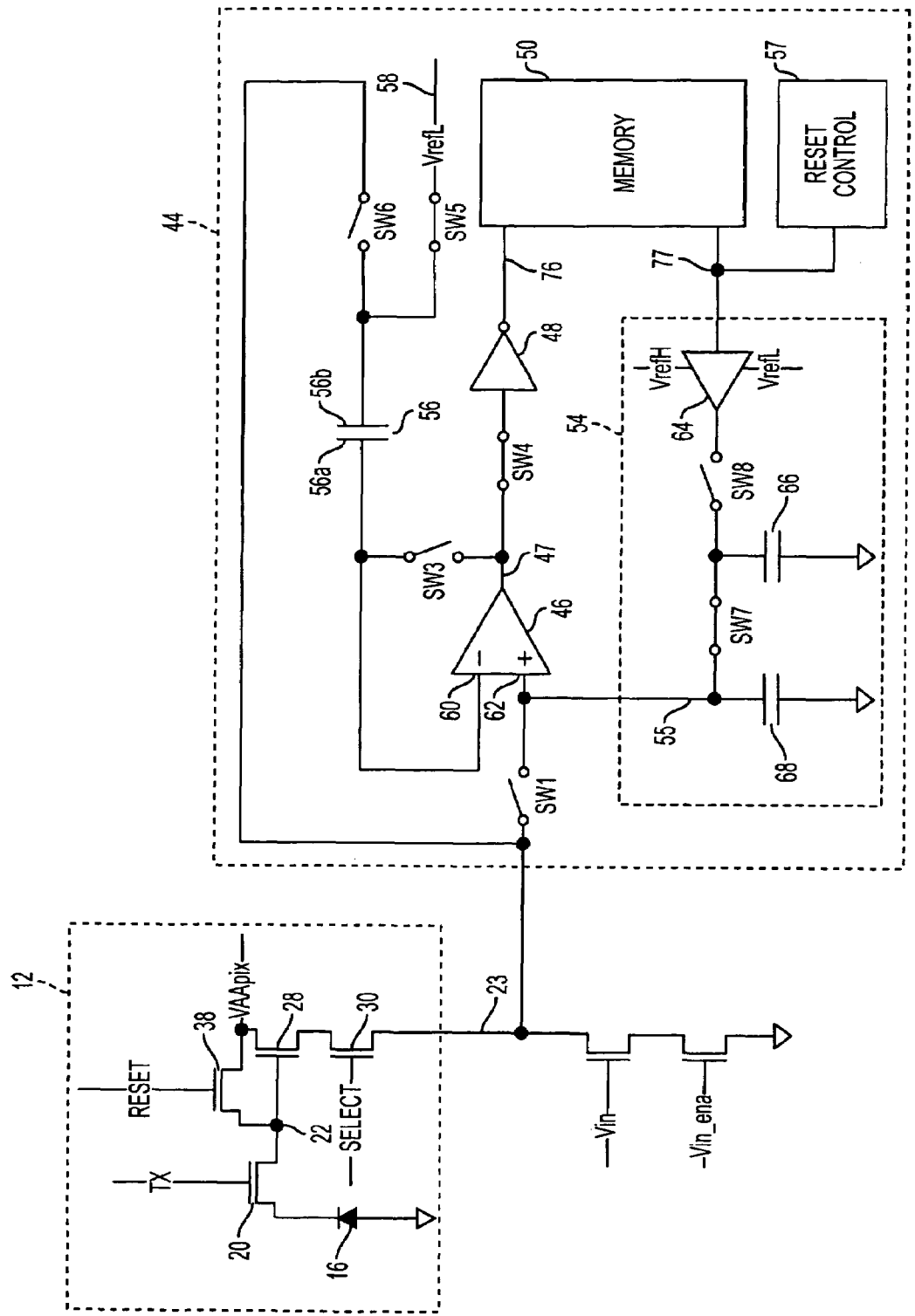
FIG. 8 is a schematic of an exemplary embodiment of the image sensor of FIG. 2 during an exemplary method of generating a bit in an N-bit series having a digital-to-analog converter charge sharing voltage generated.

During a "Charge Sharing" state, as shown in FIG. 8, switch SW7 is in the closed position and switch SW8 is in the open position. This switch configuration generates a DAC reset voltage, $DAC_{reset}$, at the output of DAC 54 that is equal to the charge shared voltage of the first capacitor 66 ($VDAC_{cap1}$) and second capacitor 68 ($VDAC_{cap2}$):

$$\tfrac{1}{2}[VDAC_{cap1}+VDAC_{cap2}]=\tfrac{1}{2}[V_{refL}+V_{refH}] \qquad (4)$$

As shown in FIG. 12, using the example voltage values of $V_{refL}$=0.8V and $V_{refH}$=2.5V:

$$DAC_{reset}=\tfrac{1}{2}[0.8V+2.5V]=1.65V \qquad (5)$$

An "MSB Bit Generation" state is now described with further reference to FIG. 8. The "MSB Bit Generation" state may be used to generate the bits of an N-bit digital series. During this state, $DAC_{out}$ is input to operational amplifier 46 via second input line 62. In this case, $DAC_{out}$ is $DAC_{reset}$ (i.e., $\tfrac{1}{2}[V_{refL}+V_{refH}]$).

During the MSB Bit Generation state, switch SW4 is in the closed position, thereby coupling the output of operational amplifier 46 to output buffer 48. Operational amplifier 46 is in compare mode and compares $V_{in}$ on first input line 60 to $DAC_{out}$ (i.e., $DAC_{reset}$) on second input line 62. Based on this comparison, operational amplifier 46 outputs an amplifier output 47 that is inverted by output buffer 48 to an inverted digital output value.

Operational amplifier 46 may be configured such that if the voltage $V_{in}$ at first input line 60 is greater than the voltage at second input line 62, then operational amplifier 46 outputs a digital low signal, which is inverted to a digital high signal by output buffer 48, (i.e., $bit_i$=high); and if the voltage $V_{in}$ at first input line 60 is not greater than the voltage at second input line 62, then operational amplifier outputs a digital high signal and output buffer 48 outputs $bit_i$=low.

As previously described, $V_{in}$ includes the ideal comparison voltage of 1.8V adjusted by the offset error of 0.05V. This adjustment compensates for offset errors that operational amplifier 46 will apply to the $DAC_{out}$ voltage. In this way, $DAC_{out}$ is effectively compared to the ideal comparison voltage. Using the example voltage values shown in FIG. 12, $DAC_{out}$=$DAC_{reset}$=1.65V and $V_{in}$=1.85V. Thus, for generation of the MSB (i.e., $bit_{N-1}$), $V_{in}$ (1.85V) is greater than $DAC_{out}$ (1.65V)—in other words, the ideal comparison voltage (1.8V) plus the amplifier offset (0.05V) that appears at input line 60 is greater than $DAC_{out}$ (1.65V) that appears at input line 62 plus the amplifier offset voltage (0.05) that will be inherently applied to $DAC_{out}$ by operational amplifier 46. Because $V_{in}$ is greater than $DAC_{out}$, operational amplifier 46 outputs a low value, which output buffer 48 inverts to high. A digital value corresponding to this high digital value from output buffer 48 is stored in memory 50 at MEM9 as corresponding to the MSB. If, for example, exemplary memory 50a (shown in FIG. 3a) were used, the bit stored at store node 80 is a low (because first tri-state inverter 74 inverts the digital signal incoming via line 75), and the bit output to bit line bus BL is high. Note that other operational amplifier configurations are also suitable—for example, the operational amplifier 46 could be configured to output a digital high if $V_{in}$>$DAC_{out}$, and a digital low if $V_{in}$<$DAC_{out}$.

An exemplary method of generating a next successive bit, $bit_i$, in an N-bit series using the ADC 44 of FIG. 2 is now described with reference to FIGS. 6-10. For i=N-2, the MSB ($bit_{N-1}$) is used to generate the next successive bit in the N-bit series, $bit_i$=N-2. According to this exemplary method, a bit corresponding to the MSB (e.g., the MSB bit) has been previously generated and stored in memory 50. For example, the MSB bit may be generated and stored in memory 50 according the method previously described with reference to FIGS. 6-8. Next, first capacitor 66 and second capacitor 68 are reset according to the First Capacitor Reset, Second Capacitor Reset, and Charge Sharing states described above with reference to FIGS. 6-8 such that the voltage at the output of DAC 54 is $DAC_{reset} = \frac{1}{2}(V_{refL} + V_{refH})$.

Figure 9:
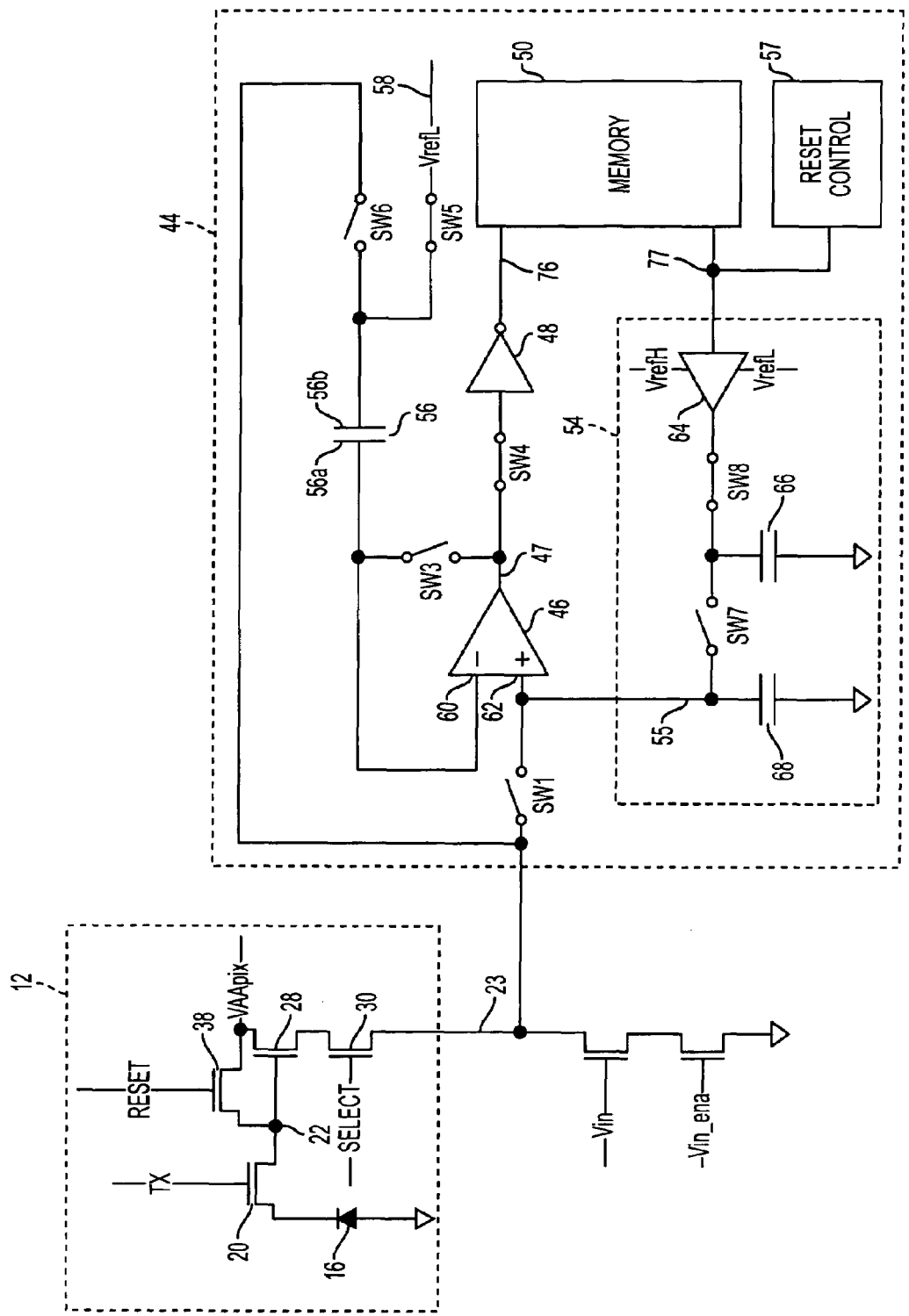
FIG. 9 is a schematic of an exemplary embodiment of the image sensor of FIG. 2 during an exemplary method of generating a bit in an N-bit series having a previously generated bit applied to a digital-to-analog converter.

As shown in FIG. 9, during a "Prior-Bit Feedback" state, a digital value corresponding to the previously generated bit ($bit_{i+1}$) is read from memory 50 and applied as an input to reference selector 64. For i=N−2, the previously generated bit is $bit_{(N-2)+1}$. Thus, a digital value corresponding to MSB, $bit_{N-1}$, is applied to reference selector 64. Reference selector 64 is configured such that if the $bit_{i+1}$ is high, reference selector 64 outputs $V_{refH}$, and if $bit_{i+1}$ is low, reference selector 64 outputs $V_{refL}$. It should be noted that other configurations are suitable, for example, reference selector 64 may be configured to output $V_{refL}$ if $bit_{i+1}$ is high, and $V_{refH}$ if $bit_{i+1}$ is low. As shown in FIG. 9, switch SW7 is in the open position and switch SW8 is in the closed position, such that reference selector 64 and first capacitor 66 are coupled together, but neither is coupled to second capacitor 68 or feedback output line 55. In this way, the reference selector 64 drives either $V_{refH}$ (if $bit_{i+1}$=high) or $V_{refL}$ (if $bit_{i+1}$=low) on to first capacitor 66. For example purposes, i=N−2 (the second most significant bit) and $bit_{i+1}$ is $bit_{N-1}$, the MSB. Using the example MSB value (high), as shown in FIG. 12, reference selector 64 outputs $V_{refH}$=2.5V which is applied to first capacitor 66.

During a "Feedback Charge Share" state (shown in FIG. 10), switch SW8 is in the open position and switch SW7 is in the closed position. This causes first and second capacitors 66, 68 to charge share such that the DAC output on line 55 is equal to one half the combined sum of the voltages on the first capacitor 66 and second capacitor 68. The voltage on first capacitor 66 is the voltage output by reference selector 64, $VDAC_{capx}$. The voltage on second capacitor 68 is the previously generated DAC output voltage. The DAC output is not used by the operational amplifier 46 to compare to $V_{in}$ for generation of $bit_i$ until the successive approximation process is complete for x=i+1 through x=N−1. Thus, until the successive approximation process is complete for x=i+1 through x=N−1, the DAC output values are generated as temporary values. Thus, the DAC output is:

$$DAC_{tempout(N-1)-x} = \frac{1}{2}[VDAC_{cap2} + VDAC_{cap1}] = \frac{1}{2}[DAC_{tempoutN-1-(x-1)} + (VDAC_{capx})] \quad (6)$$

Where $DAC_{tempout(N-1)-x}$ is the temporary DAC output being generated, $DAC_{tempout(N-1)-(x-1)}$ is the voltage on second DAC capacitor 68 (i.e., the previously generated temporary output voltage) and $VDAC_{capx}$ is the voltage on the first capacitor 66 (i.e., the reference selector 64 output ($V_{refL}$ or $V_{refH}$)).

During successive approximation, each of the previously generated bits (e.g., $bits_{i+1}$ through the MSB, $bit_{N-1}$) is successively applied to DAC 54 to generate a temporary DAC output starting with the immediately previously generated $bit_{i+1}$, and ending with the MSB; thus x in equation (6) identifies the current bit that is being read out of memory and applied to the DAC reference selector to generate $VDAC_{capx}$ and $DAC_{tempout(N-1)-x}$ for the successive approximation. Thus, temporary DAC outputs are generated until the successive approximation for a given $bit_i$ ends after inputting the MSB to DAC 54.

According to the exemplary method, $DAC_{tempout0}$ signifies that the MSB has been applied to the DAC reference selector and successive approximation using all previously generated bits has occurred. Thus, the Prior-Bit Feedback and Feedback Charge share states are repeated for x=i+1 through x=N−1, at which time $DAC_{tempout0}$ is generated.

Although SW4 is in the closed position after $DAC_{tempout0}$ is generated, preferably, switch SW4 is in the open position during generation of the temporary DAC output values that are not compared by operational amplifier 46 to $V_{in}$ in order to generate a digital bit of the N-bit series. Alternative configurations also may be used to prevent a given temporary DAC output from being used to generate a digital bit in the N-bit series. For example, a control signal may be used to prevent operational amplifier 46 from generating a bit of the N-bit series, or where exemplary memories 50a (FIG. 3a) and 50b (FIG. 3b) are used, a control signal may be applied to write line 82 to control when a digital bit is written to store node 80.

To generate $bit_i$ of an N-bit series, equation (6) is determined for x=i+1, i+2, ... N−1, where i+1 is the bit number of the immediately previously generated bit, and N−1 is the bit number of the MSB. For example, in an N-bit series where N=10 (i.e., a 10 bit series) having bits 9 through 0, the MSB is bit N−1=9. In such a series, the 3rd most significant bit would be considered $bit_{i=N-3=7}$, and in order to generate this bit, a $DAC_{outi}$ value for i=7 would be calculated by calculating equation (6) for x values of x=8 (i.e. i+1), and x=9 (i.e., i+2), where x=9=N−1. Alternatively, if the second most significant bit, $bit_{i=N-2=8}$, is being generated, then equation (6) would be calculated for just x=i+1=9 in order to determine $DAC_{outi=8}$. Thus, when generating $bit_{i=N-2}$ (i.e., the second most significant bit), the first bit applied is $bit_{x=i+1=(N-2)+1=N-1}$ (i.e., the MSB). For x=N−1, equation (6) reduces to:

$$DAC_{tempout(N-1)-(N-1)} = \frac{1}{2}[DAC_{tempoutN-1-((N-1)-1)} + (VDAC_{capN-1})] = \quad (7)$$

$$DAC_{tempout0} = \frac{1}{2}[DAC_{tempout1} + (VDAC_{capN-1})] \quad (8)$$

Here, the previously generated DAC output voltage was the $DAC_{reset}$ that was used to reset the DAC after generation of the MSB bit. Thus:

$$DAC_{tempoutN-1-(x-1)} = DAC_{tempout1} = DAC_{reset} \quad (9)$$

$VDAC_{capx=N-1}$ is the voltage applied by reference selector 64 to first capacitor 66 based on the value of $bit_{x=N-1}$ (i.e., the MSB). Using the previously described example values (shown in FIG. 12), $DAC_{reset}$=1.65V, and the MSB is (high), reference selector 66 outputs $V_{refH}$=2.5V. Thus, equation (8) reduces to:

$$DAC_{tempout0} = \frac{1}{2}[DAC_{reset} + V_{refH}] = \frac{1}{2}[1.65V + 2.5V] = 2.075V \quad (10)$$

Generation of $DAC_{tempout\ N-1-(x-1)} = DAC_{tempout0}$ signifies that successive approximation through $bit_{x=N-1}$ (i.e., the MSB has occurred).

A Successive Bit Generation state is shown in FIG. 10. During this state, $DAC_{tempout0} = DAC_{outi=2}$ is applied to second input line 62 of operational amplifier 46 and compared to $V_{in}$ for generation of $bit_{N-2}$. Operational amplifier 46 is in the compare mode, and compares $DAC_{outi=2}$ (e.g., 2.075V using the example voltage value calculated by equation (10) for i=N−2) to the incoming analog voltage signal, $V_{in}$ (e.g., 1.85V using the example voltage value). After being applied to operational amplifier 46, $DAC_{outi}$ will be adjusted up by the inherent amplifier offset (0.05V). Further $V_{in}$, as applied to input line 60, is the ideal comparison voltage of 1.8V plus the offset of 0.05V. Thus, operational amplifier 46 effectively compares the ideal comparison voltage to $DAC_{outi}$. For i=N−2, the resultant output from operational amplifier 46 is a digital bit value that is inverted by buffer 48 and stored in memory 50 as $bit_{N-2}$ of the N-bit series. For example purposes, during compare mode, operational amplifier 46 is configured to output a digital high if the voltage at the first input line 60 (e.g., $V_{in}$=1.85V) is not greater than the voltage at the second input line 62, (e.g., $DAC_{out1}$=2.075V); and output buffer 48 inverts this signal to a digital low and, as shown in FIG. 12, a digital value corresponding to the digital low is stored in memory 50 corresponding to the second most significant bit, $bit_{N-2}$.

The next successive bit, $bit_{i=N-3}$, of the N-bit series is generated as follows. DAC 54 is reset to $DAC_{reset}=\frac{1}{2}[V_{refL}+V_{refH}]$ according to the First Capacitor Reset, Second Capacitor Reset and Charge Sharing states described above with reference to FIGS. 6-8 and equation (4). Using the example voltage values described above (and shown in FIG. 12), $DAC_{reset}=\frac{1}{2}[0.8V+25V]=1.65V$. A DAC output is generated for x=i+1 as follows. A digital value corresponding to previously generated and stored $bit_{x=i+1}$ is read out from memory 50, and applied to reference selector 64 according to the Prior-Bit Feedback state previously described with reference to FIG. 9. During the Prior-Bit Feedback state, the first bit read from memory 50 to reference selector 64 for successive approximation of $bit_{i=N-3}$, is the immediately previously generated bit, $bit_{i+1}$. Thus, a digital value corresponding to $bit_{(N-3)+1}$ (i.e., $bit_{N-2}$) is applied to reference selector 64. Switch SW8 is in the closed position and switch SW7 is in the open position, and based on the value of $bit_{N-2}$, reference selector 64 outputs either $V_{refH}$ or $V_{refL}$ to first capacitor 66. Next, switch SW8 is in the open position, and switch SW7 is in the closed position, and a Feedback Charge Share state results in charge sharing between first and second capacitors 66, 68, resulting in a voltage value at the DAC output, according to Equation (6) for x=N−2:

$$DAC_{tempout(N-1)-(N-2)}=\frac{1}{2}[DAC_{tempoutN-1-((N-2)-1)}+(VDAC_{cap(N-2)})]= \quad (11)$$

$$DAC_{tempout1}=\frac{1}{2}[DAC_{tempout2}+(VDAC_{cap(N-2)})] \quad (12)$$

Where $VDAC_{capN-2}$ is the voltage output by DAC reference selector 64 ($V_{refH}$ or $V_{refL}$) corresponding to $bit_{x=N-2}$. $DAC_{tempout2}$ is the previously generated DAC output, $DAC_{reset}$. Because the $DAC_{tempout0}$ has not been generated, the successive approximation process continues, and the $DAC_{tempout1}$ value at the output of DAC 54 is not compared to $V_{in}$ for generation of the digital bit value $bit_{i=N-3}$.

Next a DAC output, $DAC_{tempout(N-1)-x}$ is generated for x=i+2. Because $bit_{i=N-3}$ is being generated, i=N−3, and x=i+2=(N−3+2)=N−1. Switch SW8 is in the closed position and switch SW7 is in the open position (so that reference selector 64 is coupled to only first capacitor 66) as shown in FIG. 9. A digital value corresponding to $bit_{i-2}$ is input to reference selector 64 as described above with reference to FIG. 9. Depending on the value of $biti_{-2}$ reference selector 64 outputs either $V_{refH}$ or $V_{refL}$, and applies the outputted reference voltage to first capacitor 66. Next, switch SW8 is opened and switch SW7 is closed as described with reference to FIG. 10, such that a DAC output signal is generated, according to Equation (6) for x=N−1:

$$DAC_{tempout(N-1)-(N-1)}=\frac{1}{2}[DAC_{tempout(N-1)-((N-1)-1)}+VDAC_{capN-1}]= \quad (13)$$

$$DAC_{tempout0}=\frac{1}{2}[DAC_{tempout1}+VDAC_{capN-1}] \quad (14)$$

Where $DAC_{tempout0}$ is $DAC_{outi=N-3}$, and $DAC_{tempout1}$ is the immediately previously generated DAC output value (i.e., the DAC output value generated during the successive approximation for x=i+1), and $VDAC_{cap}N-1$ is the voltage output by reference selector 64 ($V_{refH}$ or $V_{refL}$) corresponding to bitN−1 (i.e., corresponding to the MSB). Generation of $DAC_{tempout0}$ signifies that the Prior Bit Feedback and Feedback Charge Share states have been repeated for x=i+1 through x=N−1 and successive approximation in the feedback loop is complete for biti.

This new $DAC_{tempout0}=DAC_{out}i=N-3$ value is input to operational amplifier 46 and compared to $V_{in}$ to generate bitN−3 according to the Successive Bit Generation state previously described with reference to FIG. 10.

Using the example voltage values previously defined, MSB $bit_{x=N-1}$ was previously generated as a digital high, and the second most significant bit, $bit_{x=N-2}$ was previously generated as a digital low. $B_{iti}$=N−3 can then be determined as follows.

The DAC output value is reset to $DAC_{reset}=\frac{1}{2}[V_{refL}+V_{refH}]$=1.65V according to the First Capacitor Reset, Second Capacitor Reset, and Charge Sharing states previously described above with reference to FIGS. 6-8. Next, according to the Prior-Bit Feedback state described above with reference to FIG. 9, switch SW8 is in the closed position and switch SW7 is in the open position. Successive approximation is applied for x=i+1. Because $bit_{i=N-3}$ is being generated, x=(N−3)+1=N−2. Thus, the first bit output from memory 50 and applied to reference selector 64 corresponds to $bit_{x=N-2}$. Using the example values, $bit_{N-2}$ was previously generated as a digital low, thus reference selector 64 outputs $V_{refL}$ to first capacitor 66. Next, according to the Feedback Charge Share state (described above with reference to FIG. 10) switch SW7 is in the closed position, and switch SW8 is in the open position, causing DAC capacitors 66, 68 to charge share the voltage values of $VDAC_{capi-1}=V_{refL}$=0.8V (shown in FIG. 12 for bit i=N−3=7 at x=i+1) and the previously generated DAC output value, $DAC_{tempout(N-1)-(x-1)}$. For x=i+1, the previously generated DAC output is $DAC_{tempout(N-1)-(x-1)}=DAC_{reset}$ (e.g., 1.65V) because according to the exemplary method, DAC 54 is reset prior to generating each digital bit. Thus, the DAC output voltage is $DAC_{reset}$ at the start of successive approximation for given biti (i.e., the first time a previously generated bit (i.e., $bit_{x=i+1}$) is read into DAC 54). This results in a temporary DAC output (as shown in FIG. 12) being generated according to Equation (6) for x=N−2:

$$DAC_{tempout(N-1)-(N-2)}=\frac{1}{2}[DAC_{reset}+VDAC_{capN-2}] \quad (15)$$

$$DAC_{tempout1}=\frac{1}{2}[1.65V+0.8V]=1.225V \quad (16)$$

Next, $DACtempout_{(N-1)-x}$ is determined for x=i+2. According to the Prior Bit Feedback state, switch SW7 is opened and switch SW8 is closed, and a digital value corresponding to $bit_{x=i+2}$ is output from memory 50 and input to reference selector 64. Since i=N−3, and x=i+2, therefore x=[(N−3)+2]=N−1, and a value corresponding to the MSB, $bit_{x=N-1}$, is applied to reference selector 64. Using the example values, $bit_{x=N-1}$ was previously calculated as a digital high. Therefore, reference selector 64 outputs $V_{refH}$ which is held at first capacitor 66 as $VDAC_{capN-1}$ (shown in FIG. 12 for bit i=7 at x=i+2=9). Next, according to the Feedback Charge Share state, switch SW7 is closed, and switch SW8 is opened, resulting in charge sharing between first and second capacitors 66, 68 such that a DAC output value (shown in FIG. 12) is generated according to Equation (6) for x=N−1:

$$DAC_{tempout(N-1)-(N-1)} = \frac{1}{2}[DAC_{tempout(N-1)-((N-1)-1)} + VDAC_{capN-1}] = \quad (17)$$

$$DAC_{tempout0} = \frac{1}{2}[DAC_{tempout1} + VDAC_{capN-1}] = \quad (18)$$

$$DAC_{tempout0} = \frac{1}{2}[1.225V + 2.5V] = 1.8625V \quad (19)$$

$DAC_{tempout0}$ signifies that successive approximation using $bit_{x=i+1}$ through $bit_{x=N-1}$ is complete, and $DAC_{outi}$ (i.e., $DAC_{tempout0}$) has been generated. According to the Successive Bit Generation state $DAC_{outi}$ for i=N−3, is applied to the second input line 62 of operational amplifier 46 for generation of $bit_{i=N-3}$.

Operational amplifier 46 compares $DAC_{outi=N-3}$ to $V_{in}$, and outputs a digital value. In the present example, $DAC_{outi}$ (1.8625V) is greater than $V_{in}$ (1.85V); therefore operational amplifier 46 outputs a digital high. Output buffer 48 inverts the digital high to a digital low, and a digital value corresponding to the digital low is stored in memory 50 as corresponding to $bit_{N-3}$ of the N-bit digital series.

In the same manner as previously described for $bit_{i=N-3}$ with reference to FIGS. 6-10, a successive $bit_i$ in the N-bit digital series may be generated by resetting DAC 54 according to the First Capacitor Reset, Second Capacitor Reset, and Charge Sharing states described with reference to FIGS. 6-8. Successive DAC output values ($DAC_{tempout(N-1)-x}$) may be generated according to the Prior Bit Feedback and Feedback Charge Share states and according to equation (18) (i.e., $DAC_{tempout(N-1)-x} = \frac{1}{2}[DAC_{tempoutN-1-(x-1)} + (VDAC_{capx})]$) for x=i+1, i+2, ... N−1. Generation of $DAC_{tempout0}$ signifies that $bits_{x=i+1}$ through $bit_{x=N-1}$ have been applied to DAC reference selector 64 for generating successive $DAC_{tempout(N-1)-x}$ values, and thus $DAC_{tempout0}$ is equal to $DAC_{outi}$. According to the Successive Bit Generation state described with reference to FIG. 10, $DAC_{outi}$ is applied to second input line 62 of operational amplifier 46, which compares $DAC_{outi}$ to the signal being digitized, $V_{in}$, and outputs a digital value based on this comparison.

Figure 11C:
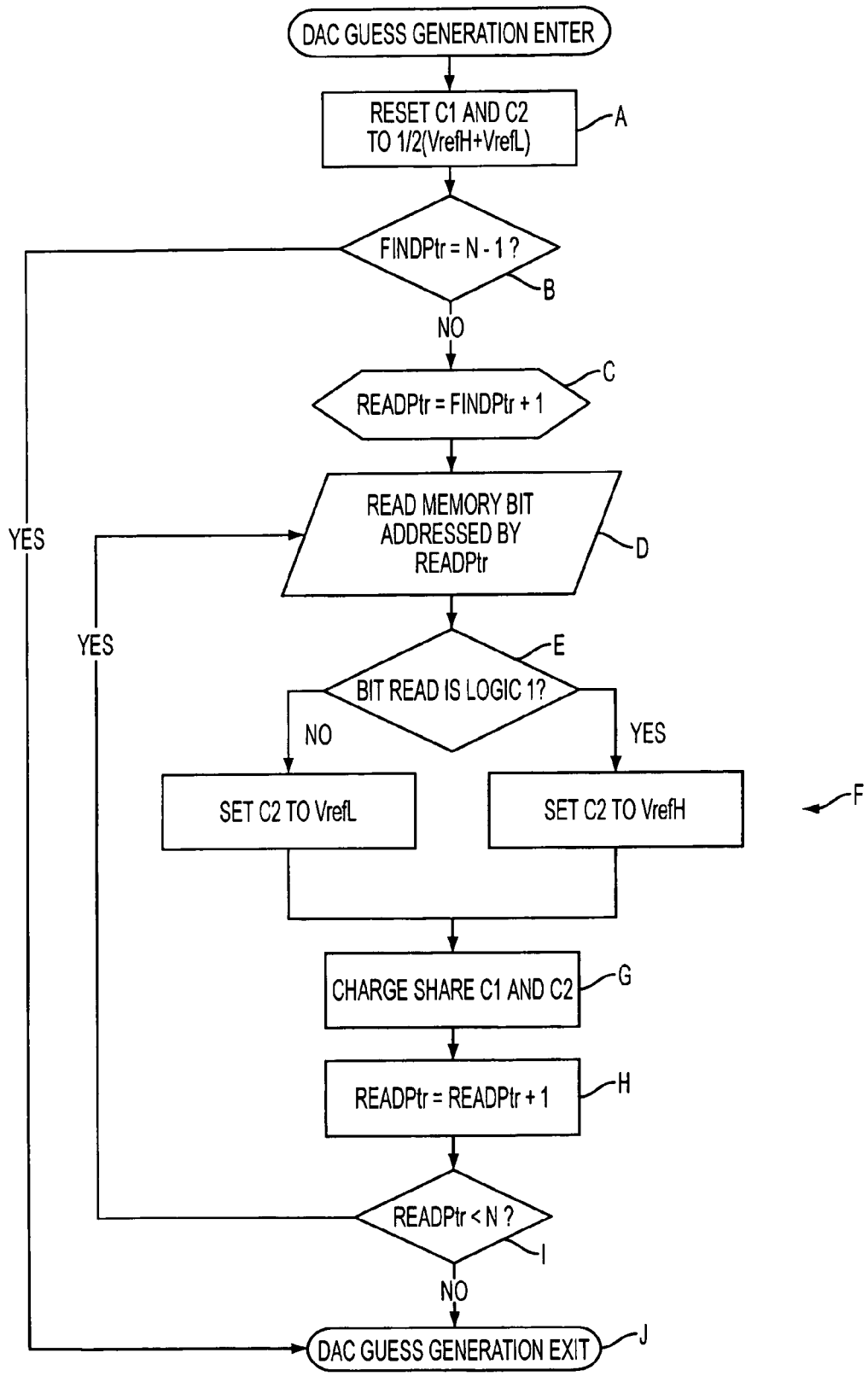
FIG. 11C is a flowchart of an exemplary embodiment of using address pointers during the exemplary method of FIGS. 6-10.

FIG. 11C illustrates an exemplary pointer flow for generating $DAC_{outi}$. As shown in FIG. 11C step A, DAC 54 is reset. For example, DAC 54 may be reset by resetting first capacitor 66 and second capacitor 68 according to the First Capacitor Reset, Second Capacitor Reset and Charge Sharing states described above with reference to FIGS. 6-8 such that the output voltage of DAC 54 is ½ ($V_{refH} + V_{refL}$). As shown in FIG. 11C, FINDPTR identifies the $bit_i$; that is being approximated. This bit corresponds to points of a bit address i, in which a digital value corresponding to the bit currently being generated by ADC 44 (i.e., $bit_i$), will be stored. If, as shown in step B, FINDPTR is pointing to address N−1, which corresponds to $bit_{N-1}$, the MSB is being generated and the process exits to Step J as additional successive approximation steps are not needed. If, as shown in FIG. 11C step B, FINDPTR is not pointing to address N−1 (which indicates the MSB has already been generated), then the process continues through steps C through I to perform successive approximation to generate a DAC output value (e.g., $DAC_{outi}$) to be compared to $V_{in}$ for generation of $bit_i$.

At Step C, a pointer, READPTR is set to FINDPTR+1. This causes READPTR to point to address i+1, which contains a digital value corresponding to $bit_{i+1}$. At step D, $bit_{i+1}$ is read from memory. A digital value corresponding to $bit_{i+1}$ is applied to reference selector 64 (as previously described with reference to the Prior-Bit Feedback state and FIG. 9). At step E a reference value is output based on the value of $bit_{i+1}$. For example, as previously described with reference to the Prior-Bit Feedback state and FIG. 9, the reference selector 64 may be configured such that if the digital value corresponding to $bit_{i+1}$ is logic high (e.g., logic 1), then first capacitor 66 is set to $V_{refH}$, and if not, then first capacitor 66 is set to $V_{refL}$. Thus, if at Step E, the digital value corresponding to $bit_{i+1}$ is logical high, C2 is set to $V_{refH}$ (step F); otherwise C2 is set to $V_{refL}$ (step F).

At step G, first capacitor 66 and second capacitor 68 charge share such that the output of DAC 54 is one half the sum of the voltages on first capacitor 66 and second capacitor 68. The voltage on first capacitor 66 is the voltage output by reference selector 64, which, as previously described with reference to the Feedback Charge Share state and FIG. 10, is $VDAC_{capx}$. The voltage on second capacitor 68 is the previous DAC output voltage value (e.g., $DAC_{tempoutN-1-(x-1)}$ as previously described with reference to FIG. 10) and thus, the charge shared voltage is the voltage of Equation (6): $DAC_{tempout(N-1)-x} = \frac{1}{2}[DAC_{tempoutN-1-(x-1)} + (VDAC_{capx})]$.

At step H, READPTR is incremented so that it now points to $bit_{i+2}$, and if, at step I, the READPTR is less than N, the process loops back to step D. Steps D-I are repeated until READPTR is no longer less than N (which signifies that the digital value corresponding to the MSB has been read in and applied to DAC 64 through successive approximation), and the process exits to Step J.

Figure 13:
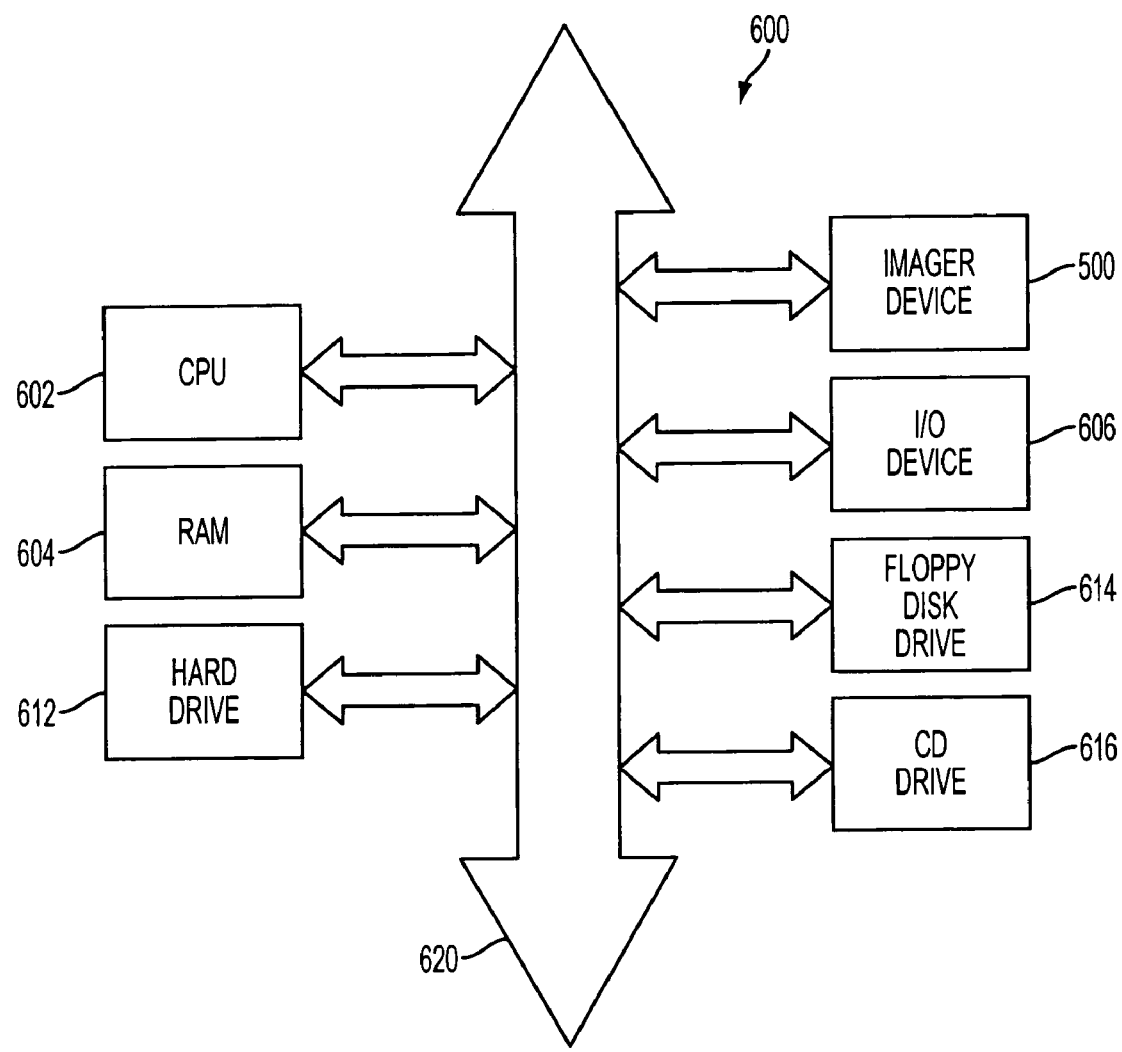
FIG. 13 is a diagram of a processor system incorporating an image sensor comprising an analog-to-digital converter constructed in accordance with an exemplary embodiment of the invention.

FIG. 13 shows system 600, a typical processor based system modified to include an imager device 500 comprising an ADC of the present invention. Examples of processor based systems, which may employ the imager device 500, include, without limitation, computer systems, camera systems, scanners, machine vision systems, vehicle navigation systems, video telephones, surveillance systems, auto focus systems, star tracker systems, motion detection systems, image stabilization systems, and others.

System 600 includes a central processing unit (CPU) 602 that communicates with various devices over a bus 620. Some of the devices connected to the bus 620 provide communication into and out of the system 600, illustratively including an input/output (I/O) device 606 and imager device 500. Other devices connected to the bus 620 provide memory, illustratively including a random access memory (RAM) 604, hard drive 612, and one or more peripheral memory devices such as a floppy disk drive 614 and compact disk (CD) drive 616. The imager device 500 may be combined with a processor, such as a CPU, digital signal processor, or microprocessor, in a single integrated circuit. The imager device 500 may be a CCD imager or CMOS imager constructed in accordance with any of the illustrated embodiments.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modification, though presently unforeseeable, of the present invention that comes within the spirit and scope of the following claims should be considered part of the present invention.

The invention claimed is:

1. A method of operating an image sensor, said method comprising:
holding a first analog input signal at the output of a digital-to-analog converter, said first analog input signal including a floating diffusion reset voltage;

applying said first analog input signal from the output of said digital-to-analog converter to an operational amplifier having a first input line and a second input line, the floating diffusion reset voltage being applied to the second input line to generate an operational amplifier output;

applying the operational amplifier output to a first side of a sample and hold capacitor;

applying a second analog input signal to a second side of the sample and hold capacitor to generate an adjusted input voltage across said sample and hold capacitor, wherein the adjusted input voltage is the difference between the voltage at the first side of said sample and hold capacitor and the voltage at the second side of said sample and hold capacitor; and applying the adjusted input voltage to the first input line of said operational amplifier.

2. The method of operating an image sensor of claim 1 wherein:

said voltage at said second side of said sample and hold capacitor further includes a reference voltage.

3. A method of generating an adjusted pixel voltage signal in an imager, said method comprising:

generating a floating diffusion reset voltage;

applying the floating diffusion reset voltage to a side one of a sample and hold capacitor of an analog-to-digital converter;

generating a pixel signal voltage;

applying the pixel signal voltage to a side two of the sample and hold capacitor;

generating the adjusted pixel voltage signal based on the floating diffusion reset voltage at side one of the sample and hold capacitor and the pixel signal voltage at side two of said sample and hold capacitor.

4. The method of generating an adjusted pixel voltage signal of claim 3, further comprising digitizing the adjusted pixel voltage signal.

5. The method of generating the adjusted pixel voltage signal of claim 3 wherein the step of applying the floating diffusion reset voltage further comprises first applying the floating diffusion reset voltage to an operational amplifier of the analog-to-digital converter, then applying an amplifier output signal corresponding to said floating diffusion reset voltage to side one of the sample and hold capacitor.

* * * * *